(12) United States Patent
Eom

(10) Patent No.: US 12,341,095 B2
(45) Date of Patent: Jun. 24, 2025

(54) SEMICONDUCTOR DEVICE AND METHOD OF FORMING PATTERNS FOR A SEMICONDUCTOR DEVICE

(71) Applicant: SK hynix Inc., Icheon-si (KR)

(72) Inventor: Dae Sung Eom, Cheongju-si (KR)

(73) Assignee: SK hynix Inc., Icheon-si (KR)

( * ) Notice: Subject to any disclaimer, the term of this patent is extended or adjusted under 35 U.S.C. 154(b) by 415 days.

(21) Appl. No.: 17/673,661

(22) Filed: Feb. 16, 2022

(65) Prior Publication Data
US 2022/0173029 A1    Jun. 2, 2022

Related U.S. Application Data

(62) Division of application No. 16/439,259, filed on Jun. 12, 2019, now Pat. No. 11,289,420.

(30) Foreign Application Priority Data

Nov. 2, 2018    (KR) .................. 10-2018-0133334

(51) Int. Cl.
| | | |
|---|---|---|
| *H01L 23/528* | (2006.01) | |
| *H01L 21/033* | (2006.01) | |
| *H01L 21/311* | (2006.01) | |
| *H01L 21/768* | (2006.01) | |
| *H01L 23/522* | (2006.01) | |

(52) U.S. Cl.
CPC ........ *H01L 23/528* (2013.01); *H01L 21/0337* (2013.01); *H01L 21/31111* (2013.01); *H01L 21/76816* (2013.01); *H01L 21/76838* (2013.01); *H01L 23/5226* (2013.01)

(58) Field of Classification Search
None
See application file for complete search history.

(56) References Cited

U.S. PATENT DOCUMENTS

| | | |
|---|---|---|
| 9,153,535 B1 | 10/2015 | Wu et al. |
| 9,847,339 B2 | 12/2017 | Hung et al. |
| 2008/0151626 A1* | 6/2008 | Fukuda ............... G11C 7/18 365/185.13 |
| 2008/0225591 A1 | 9/2008 | Hosono et al. |
| 2013/0049211 A1 | 2/2013 | Eom |
| 2013/0193518 A1 | 8/2013 | Kang et al. |
| 2014/0131879 A1* | 5/2014 | Kodama ............. H01L 21/0337 257/773 |
| 2014/0151777 A1 | 6/2014 | Sim et al. |

(Continued)

FOREIGN PATENT DOCUMENTS

| | | |
|---|---|---|
| CN | 106486460 A | 3/2017 |
| KR | 1019990002982 A | 1/1999 |

(Continued)

*Primary Examiner* — Aaron J Gray
(74) *Attorney, Agent, or Firm* — WILLIAM PARK & ASSOCIATES LTD.

(57) ABSTRACT

A semiconductor device includes a first conductive pattern having a first line portion extending in a first direction and a first bending portion that extends from the first line portion. A closed area, surrounded by the first line portion and the first bending portion, is defined at one side of the first line portion. The semiconductor device further includes a second conductive pattern disposed in the closed area, the second conductive pattern being spaced apart from the first conductive pattern.

6 Claims, 19 Drawing Sheets

(56) References Cited

U.S. PATENT DOCUMENTS

| | | | |
|---|---|---|---|
| 2015/0179563 | A1 | 6/2015 | Nagashima et al. |
| 2016/0035396 | A1 | 2/2016 | Naito et al. |
| 2016/0181110 | A1 | 6/2016 | Yen et al. |
| 2016/0233159 | A1* | 8/2016 | Song .................. H10D 89/10 |
| 2017/0062327 | A1 | 3/2017 | Kim et al. |
| 2018/0130818 | A1 | 5/2018 | Kim et al. |
| 2019/0318997 | A1* | 10/2019 | Kawabata ............ H10D 62/378 |

FOREIGN PATENT DOCUMENTS

| | | |
|---|---|---|
| KR | 1020120088181 A | 8/2012 |
| KR | 1020130072672 A | 7/2013 |
| KR | 1020160082388 A | 7/2016 |
| KR | 101692407 B1 | 1/2017 |

* cited by examiner

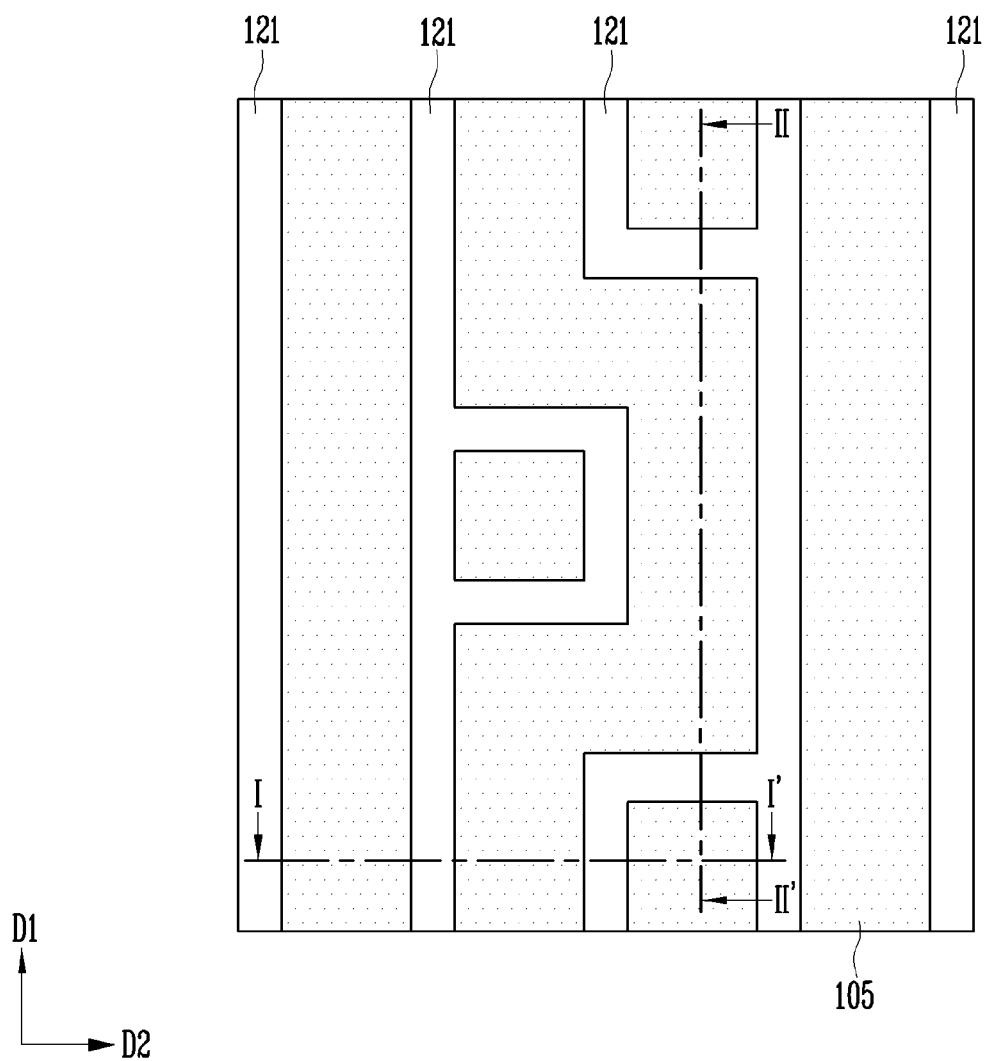

SEMICONDUCTOR DEVICE AND METHOD OF FORMING PATTERNS FOR A SEMICONDUCTOR DEVICE

CROSS-REFERENCE TO RELATED APPLICATION

The present application is a divisional application of U.S. patent application Ser. No. 16/439,259, filed on Jun. 12, 2019, and claims priority under 35 U.S.C. § 119(a) to Korean patent application number 10-2018-0133334, filed on Nov. 2, 2018, the disclosure of which is incorporated herein by reference in its entirety.

BACKGROUND

1. Technical Field

The present disclosure generally relates to a semiconductor device, and more particularly, to a semiconductor device including a plurality of patterns and a method of forming patterns for a semiconductor device.

2. Related Art

In order to improve the degree of integration of semiconductor devices, patterns for the semiconductor devices may be formed with high density. A Spacer Patterning Technology (SPT) may be used to form patterns for semiconductor devices with high density. When the SPT is used, a technology capable of improving the complexity of lines is lacking.

SUMMARY

According to an aspect of the present disclosure, there is provided a method of forming patterns for a semiconductor device. The method includes forming spacers spaced apart from each other on a target layer. The spacers include a first spacer extending in a first direction, a second spacer including first line portions that are parallel to the first spacer and are spaced apart from each other in the first direction and a first bending portion that is connected to the first line portions and protrudes in a second direction from the first line portions, and a third spacer surrounding the circumference of a closed area between the first line portions. The method further includes etching portions of the target layer, which are opened by the spacers.

According to another aspect of the present disclosure, there is provided a semiconductor device which includes a first conductive pattern including a first line portion extending in a first direction and a first bending portion that extends from the first line portion. A closed area, surrounded by the first line portion and the first bending portion, is defined at one side of the first line portion. The semiconductor device further includes a second conductive pattern disposed in the closed area, the second conductive pattern being spaced apart from the first conductive pattern.

BRIEF DESCRIPTION OF THE DRAWINGS

FIGS. 4A to 4C, 5A to 5C, 6, 7A to 7C, 8A to 8C, 9A to 9C, and 10A to 10C are views illustrating a method of forming patterns, according to an embodiment of the present disclosure.

DETAILED DESCRIPTION

Hereinafter, various example embodiments are described in detail with reference to the accompanying drawings. The drawings are provided to allow those with ordinary skill in the art to understand the scope of the embodiments of the teachings. The present teachings may, however, be embodied in different forms and should not be construed as being limited to the embodiments set forth herein. Rather, these embodiments are provided so that this disclosure will be enabling. In addition, the embodiments are provided to convey aspects of the present teachings to those skilled in the art.

While terms such as "first" and "second" may be used to describe various components, such components must not be understood as being limited by the above terms. The above terms are used to distinguish one component from another. For example, a first component may be referred to as a second component and vice versa without departing from the scope of the present disclosure.

It will be understood that when an element is referred to as being "connected" or "coupled" to another element, it can be directly connected or coupled to the other element, or intervening elements may also be present. In contrast, when an element is referred to as being "directly connected" or "directly coupled" to another element, no intervening elements are present. Other expressions describing relationships between components, such as "~ between," "immediately ~ between" or "adjacent to ~" and "directly adjacent to ~" may be construed similarly.

Terms used in the present application are used to describe particular embodiments and are not intended to limit the present disclosure. Singular forms in the present disclosure are intended to include the plural forms as well, unless the context clearly indicates otherwise. It will be further understood that terms such as "including" or "having," etc., are intended to indicate the existence of the features, numbers, operations, actions, components, parts, or combinations thereof disclosed in the specification, and are not intended to preclude the possibility that one or more other features, numbers, operations, actions, components, parts, or combinations thereof may exist or may be added.

Various embodiments provide a semiconductor device capable of improving the degree of freedom of lines and a method of forming patterns for a semiconductor device.

Figure 1A:
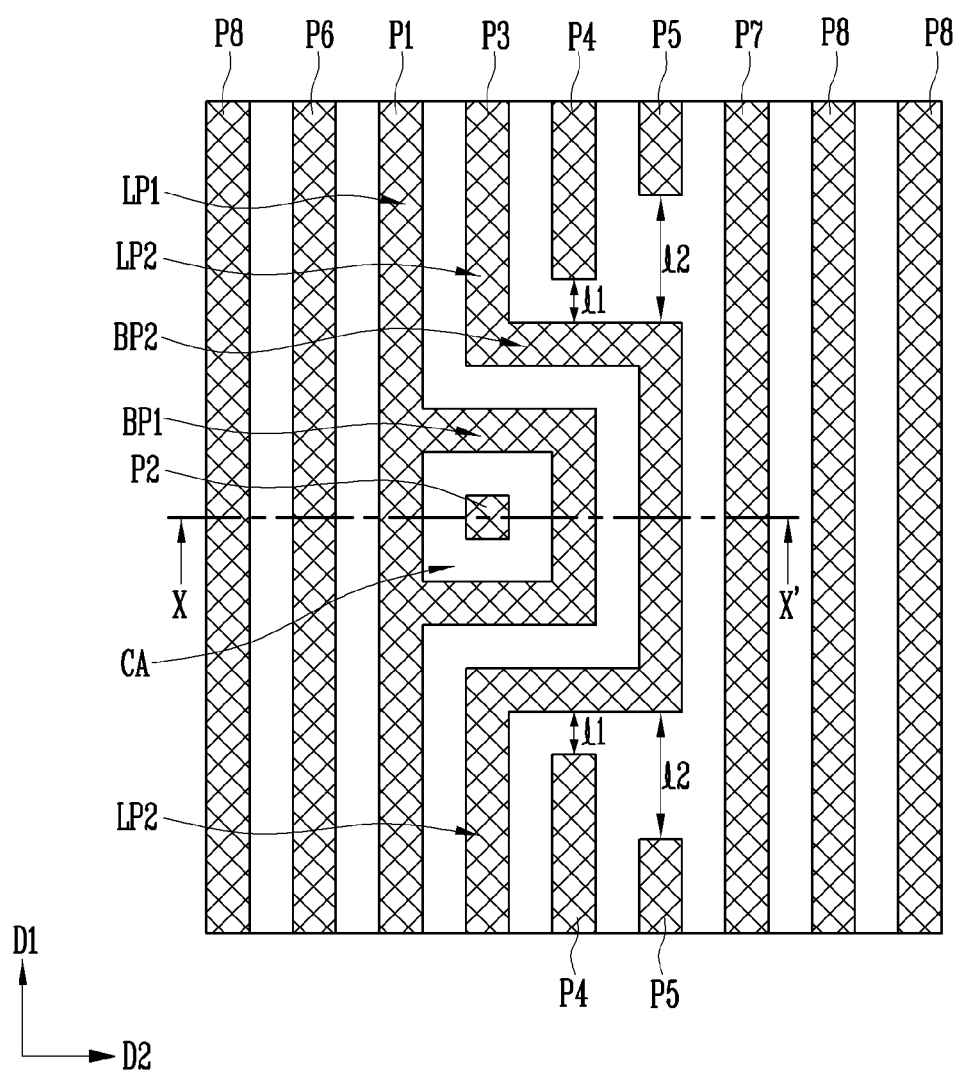
FIGS. 1A and 1B are plan and sectional views, respectively, illustrating patterns for a semiconductor device, according to an embodiment of the present disclosure.
Figure 1B:
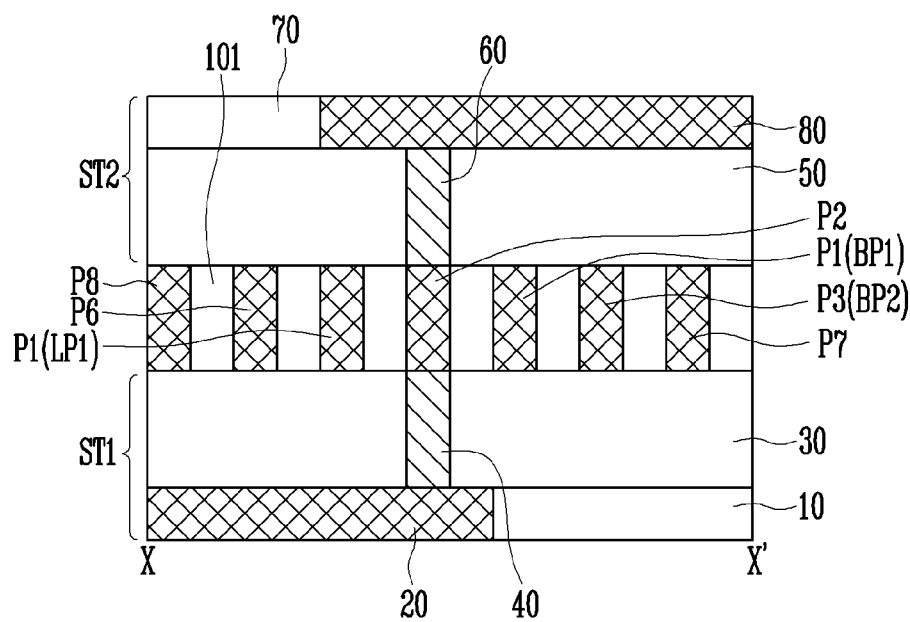

FIGS. 1A and 1B are plan and sectional views, respectively, illustrating patterns for a semiconductor device, according to an embodiment of the present disclosure. FIG. 1A illustrates a layout of the patterns. FIG. 1B illustrates a sectional view taken along line X-X' shown in FIG. 1A.

Referring to FIG. 1A, the semiconductor device may include patterns spaced apart from each other. The patterns may be finely formed by using a Spacer Patterning Technology (SPT). A process of forming fine patterns by the SPT is described in detail below with reference to FIGS. 4A to 10C.

The fine patterns may include first to eighth conductive patterns P1, P2, P3, P4, P5, P6, P7, and P8. Positions, arrangements, and shapes of the first to eighth conductive patterns P1 to P8 shown in FIG. 1A may be related to positions, arrangements, and shapes of fine patterns and the fine patterns may constitute a partial area of the semiconductor device. The first to eighth conductive patterns P1 to P8 may include portions extending to another area of the semiconductor device, which is not shown in FIG. 1A. The positions, arrangements, and shapes of the portions the first to eighth conductive patterns P1 to P8 extending to another area of the semiconductor device may be different from those shown in FIG. 1A.

A first direction D1 and a second direction D2 are shown in FIG. 1A as perpendicular directions that intersect each other in a horizontal plane. The second direction D2 is different from the first direction D1. The first and second directions D1 and D2 are not parallel to each other. For some embodiments, the first and second directions D1 and D2 are substantially perpendicular with an angle between them of approximately 90 degrees. The first to eighth conductive patterns P1 to P8 are disposed on the horizontal plane extending in the first direction D1 and the second direction D2 and spaced apart from each other.

The first conductive pattern P1 may include a first line portion LP1 and a first bending portion BP1. The first conductive pattern P1 may surround a closed area CA. The first line portion PL1 extends in the first direction D1. The closed area CA may be defined at one side of the first line portion LP1, which faces the second direction D2. The first bending portion BP1 extends from the first line portion LP1 and surrounds the closed area CA. The closed area CA may be formed in a quadrangular shape, as shown, for some embodiments. The first bending portion BP1 may be bent at right angles. The first bending portion BP1 may provide the first conductive pattern P1 with directionality in a direction other than the first direction D1. Accordingly, when a connection line connected to the first conductive pattern P1 is disposed above or under the first conductive pattern P1, the degree of arrangement freedom of the connection line is increased.

The second conductive pattern P2 is disposed in the closed area CA. The second conductive pattern P2 may be used as a contact plug connected to at least one line disposed above or under the first to eighth conductive patterns P1 to P8. A vertical connection structure between the second conductive pattern P2 and a line connected thereto is described below with reference to FIG. 1B.

The third conductive pattern P3 may include second line portions LP2 and a second bending portion BP2. The second bending portion BP2 may be spaced apart from the first bending portion BP1 and extend parallel to the first bending portion BP1. The second line portions LP2 may extend parallel to the first line portion LP1 from both ends of the second bending portion BP2. A distance between the first bending portion BP1 and the second bending portion BP2 may be equal to that between each of the second line portions LP2 and the first line portion LP1. The first bending portion BP1, the closed area CA, and the second conductive pattern P2 may be disposed in a space between the second line portions LP2. The second conductive pattern P2 and the second line portions LP2 may be aligned on one straight line in the first direction D1. The distance between the first bending portion BP1 and the second bending portion BP2 may be equal to the distance between the first conductive pattern P1 and the second conductive pattern P2. The second bending portion BP2 may provide the third conductive pattern P3 with directionality in a direction other than the first direction D1. Accordingly, when a connection line connected to the third conductive pattern P3 is disposed above or under the third conductive pattern P3, the degree of arrangement freedom of the connection line is increased.

The fourth conductive patterns P4 are patterns respectively adjacent to the second line portions LP2. The fourth conductive patterns P4 may be spaced apart from the second line portions LP2 in the second direction D2 and may extend in parallel to the second line portions LP2. A distance between the fourth conductive pattern P4 and the second line portion LP2, which are adjacent to each other, may be equal to the distance between the first bending portion BP1 and the second bending portion BP2. The fourth conductive patterns P4 are spaced apart from each other in the first direction D1. The second bending portion BP2 extends between the fourth conductive patterns P4 and is spaced apart from the fourth conductive patterns P4. Each of the fourth conductive patterns P4 and the second bending portion BP2 may be spaced apart from each other by a first distance $\ell 1$. The first distance $\ell 1$ may be equal to the distance between the first bending portion BP1 and the second bending portion BP2.

The fifth conductive patterns P5 are patterns respectively adjacent to the fourth conductive patterns P4. The fifth conductive patterns P5 extend in parallel to the fourth conductive patterns P4 and are spaced apart from the fourth conductive patterns P4 in the second direction D2. A distance between the fifth conductive pattern P5 and the fourth conductive pattern P4, which are adjacent to each other, may be equal to the distance between the first bending portion BP1 and the second bending portion BP2. The fifth conductive patterns P5 are spaced apart from each other in the first direction D1. The second bending portion BP2 extends between the fifth conductive patterns P5 and is spaced apart from the fifth conductive patterns P5. Each of the fifth conductive patterns P5 and the second bending portion BP2 may be spaced apart from each other by a second distance $\ell 2$. The second distance $\ell 2$ may be larger than the first distance $\ell 1$. The second distance $\ell 2$ may be larger than the distance between the first bending portion BP1 and the second bending portion BP2.

The sixth conductive pattern P6 may extend parallel to the first line portion LP1 while being adjacent to the first conductive pattern P1. The first conductive pattern P1 may be spaced apart from the sixth conductive pattern P6 in the second direction D2.

The seventh conductive pattern P7 is spaced apart from the fifth conductive patterns P5 and the second bending portion BP2 in the second direction D2, and extends in the first direction D1. The first to fifth conductive patterns P1 to P5 are disposed between the sixth conductive pattern P6 and the seventh conductive pattern P7. The seventh conductive pattern P7 may extend parallel to the first line portion LP1. A distance between the first line portion LP1 and the sixth conductive pattern P6, a distance between each of the fifth conductive patterns P5 and the seventh conductive pattern P7, and a distance between the seventh conductive pattern P7 and the second bending portion BP2 may all be equal to one another.

The eighth conductive patterns P8 may be arranged at both sides of the first to seventh conductive patterns P1 to P7. Each of the eighth conductive patterns P8 may extend in the first direction D1. Each of the eighth conductive patterns P8 may be parallel to the first line portion LP1. A distance between the eighth conductive pattern P8 and the sixth conductive pattern P6, which are adjacent to each other, a distance between the eighth conductive pattern P8 and the seventh conductive pattern P7, which are adjacent to each other, and a distance between the two eighth conductive patterns P8 adjacent to each other may be equal to one another.

Referring to FIG. 1B, the fine patterns including the first to eighth conductive patterns P1 to P8 may be formed while penetrating an insulating layer 101, and may be spaced apart from each other by the insulating layer 101.

In an embodiment, the insulating layer 101 penetrated by the first to eighth conductive patterns P1 to P8 may be disposed between a first structure ST1 and a second structure ST2 from a vertical viewpoint. The first structure ST1 may be defined as a structure disposed under the insulating layer 101, and the second structure ST2 may be defined as a structure disposed above the insulating layer 101.

The first structure ST1 may include a first lower insulating layer 10, a lower conductive pattern 20, a second lower insulating layer 30, and a lower contact plug 40. The lower conductive pattern 20 may be a connection line that penetrates the first lower insulating layer 10 and transmits a signal. The second lower insulating layer 30 may cover the lower conductive pattern 20. The lower contact plug 40 may penetrate the second lower insulating layer 30 to connect with the lower conductive pattern 20, and may extend toward the second conductive pattern P2. The second conductive pattern P2 and the lower conductive pattern 20 may be electrically connected to each other by the lower contact plug 40.

The second structure ST2 may include a first upper insulating layer 50, an upper contact plug 60, a second upper insulating layer 70, and an upper conductive pattern 80. The first upper insulating layer 50 may be disposed on the insulating layer 101 penetrated by the first to eighth conductive patterns P1 to P8. The upper contact plug 60 may penetrate the first upper insulating layer 50 to connect with the second conductive pattern P2. The upper conductive pattern 80 may extend in a horizontal direction to overlap with the first upper insulating layer 50. The upper conductive pattern 80 may be a connection line for transmitting a signal. The upper conductive pattern 80 and the second conductive pattern P2 may be electrically connected to each other by the upper contact plug 60.

As described above, the second conductive pattern P2 may be used as a structure for connecting the upper conductive pattern 80 disposed above the insulating layer 101 and the lower conductive pattern 20 disposed under the insulating layer 101 to each other. Because the second conductive pattern P2 is disposed in the closed area CA defined by the first conductive pattern P1, the structure for connecting the upper conductive pattern 80 and the lower conductive pattern 20 to each other may be provided within a limited area. Accordingly, the degree of freedom with respect to the layout of the lower conductive pattern 20 and the upper conductive pattern 80 is increased within the limited area.

Figure 2:
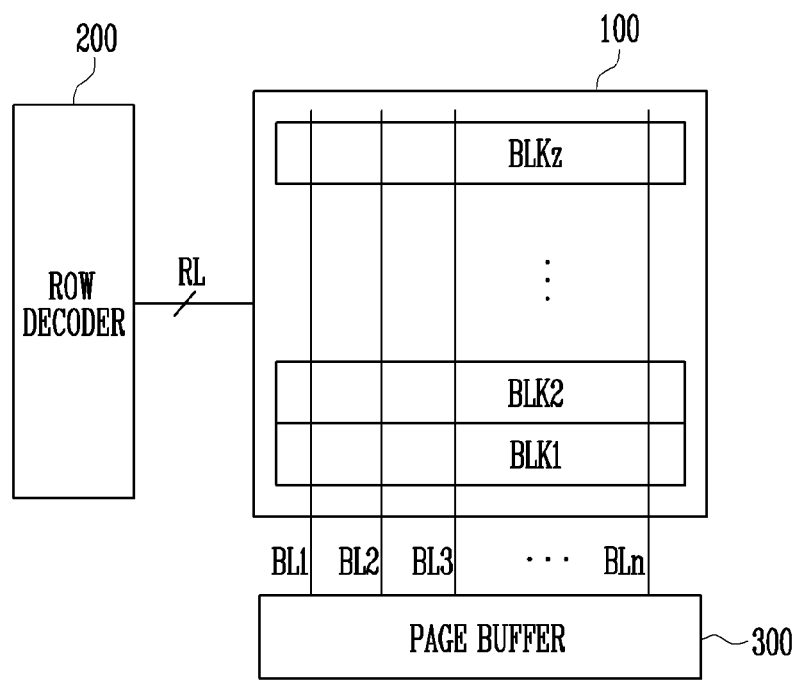
FIG. 2 is a block diagram illustrating a semiconductor device, according to an embodiment of the present disclosure.

FIG. 2 is a block diagram illustrating a semiconductor device according to an embodiment of the present disclosure.

Referring to FIG. 2, the semiconductor device may include a memory cell array 100, a row decoder 200, and a page buffer 300. The semiconductor device may be a nonvolatile memory device. For example, the semiconductor device may be a flash memory. However, another embodiment may relate to another nonvolatile memory device in addition to flash memory. For example, the nonvolatile memory device may include a Read Only Memory (ROM), a Mask ROM (MROM), a Programmable ROM (PROM), an Erasable Programmable ROM (EPROM), an Electrically Erasable Programmable ROM (EEPROM), a Ferromagnetic ROM (FROM), a Phase change RAM (PRAM), a Magnetic RAM (MRAM), a Resistive RAM (RRAM), a NOR flash memory, and the like.

The memory cell array 100 includes a plurality of memory blocks BLK1 to BLKz. The plurality of memory blocks BLK1 to BLKz may be connected to the row decoder 200 through row lines RL, and may be connected to the page buffer 300 through bit lines BL1 to BLn.

The row lines RL may include drain select lines, word lines, dummy word lines, source select lines, and a common source line. The row decoder 200 receives an address, and transmits an operating voltage to selected lines among the row lines RL according to the received address.

The page buffer 300 may include a plurality of transistors for selecting the bit lines BL1 to BLn. The transistors constituting the page buffer 300 may be disposed under the bit lines BL1 to BLn. A connecting structure may be provided so as to connect the page buffer 300 and the bit lines BL1 to BLn to each other. The connecting structure may include conductive patterns disposed in the same layer as the bit lines BL1 to BLn, connection lines disposed above or under the layer in which the conductive patterns are disposed, and contact plugs disposed between the connection lines and the conductive patterns.

The first and third to eighth conductive patterns P1 and P3 to P8 shown in FIG. 1A may constitute the bit lines BL1 to BLn shown in FIG. 2 and some of the conductive patterns of the connecting structure, which are formed in the same layer as the bit lines BL1 to BLn.

Each of the plurality of memory blocks BLK1 to BLKz incudes a plurality of memory cells. The plurality of memory cells may be nonvolatile memory cells. The plurality of memory cells may be divided into a plurality of cell strings. Each of the plurality of memory cells may store data of one bit or data of two or more bits.

Figure 3A:
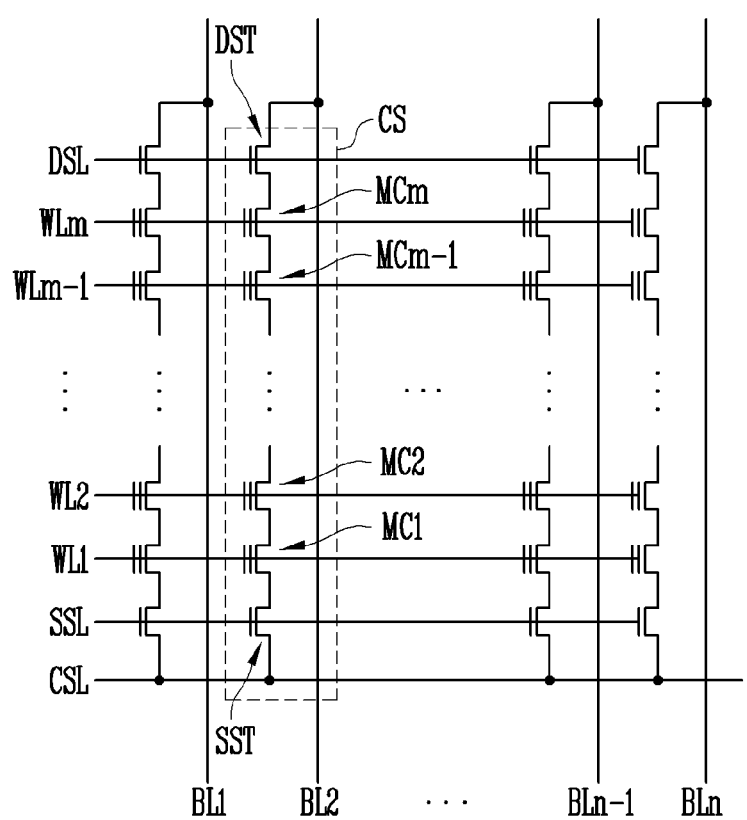
FIGS. 3A to 3C illustrate equivalent circuits of memory cell arrays, according to embodiments of the present disclosure.
Figure 3B:
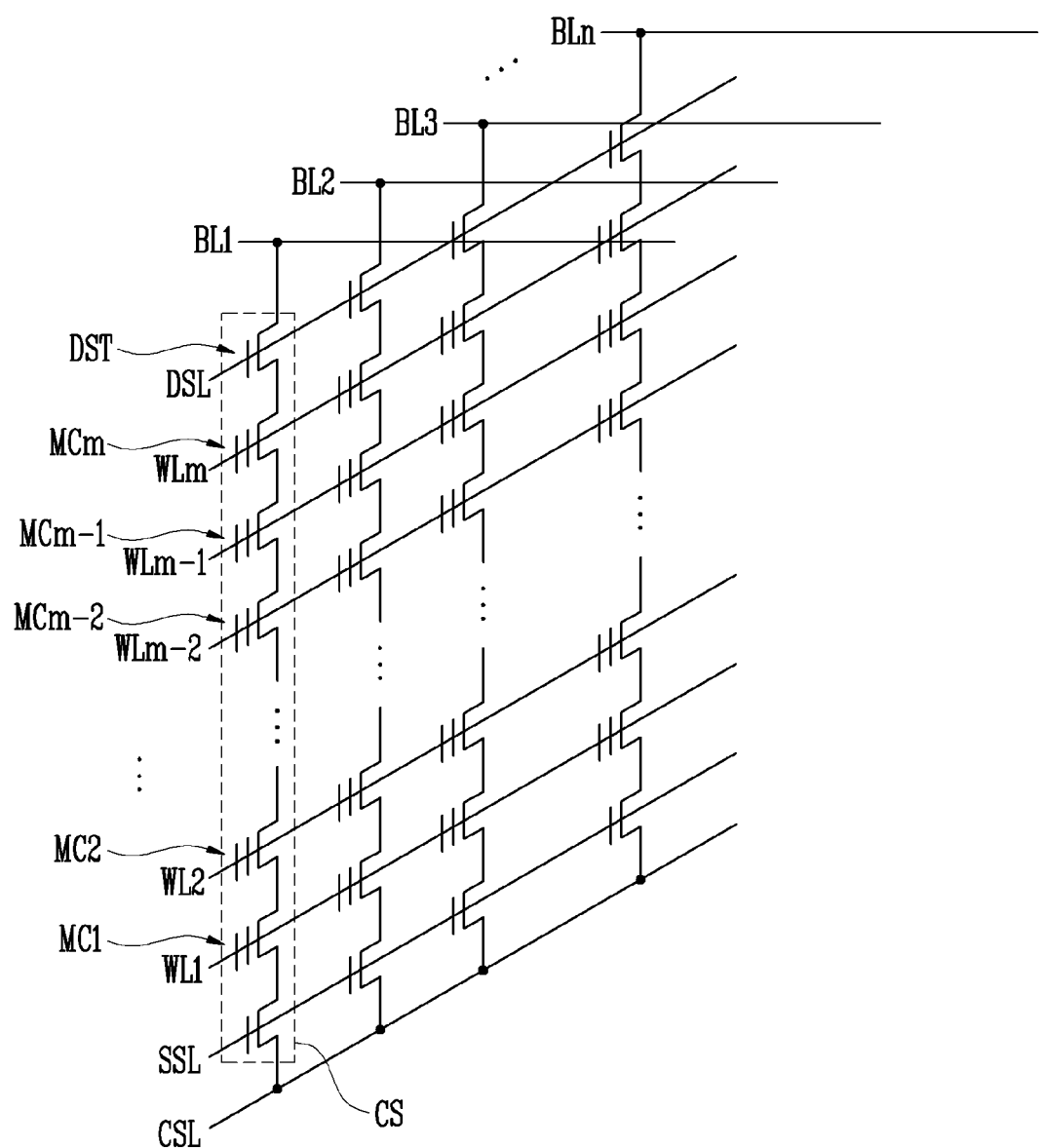
Figure 3C:
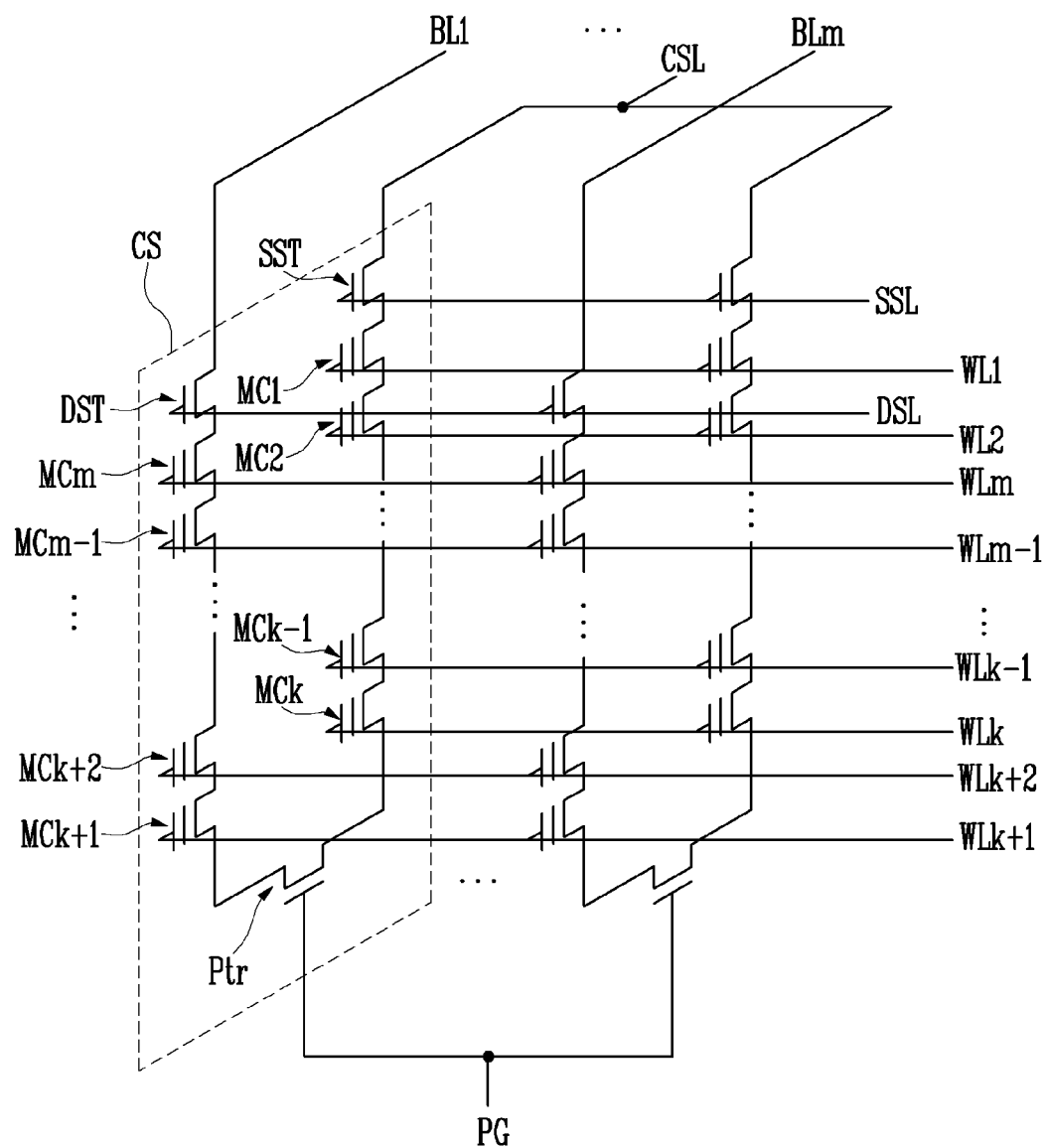

FIGS. 3A to 3C illustrate equivalent circuits of memory cell arrays, according to embodiments of the present disclosure.

Referring to FIGS. 3A to 3C, each of the memory cell arrays may include a plurality of cell strings CS. Each of the cell strings CS may be connected between a corresponding one of bit lines BL1 to BLn and a common source line CSL.

The memory cell array may be a two-dimensional array, as shown in FIG. 3A, or be a three-dimensional array, as shown in FIG. 3B or 3C. Each of the cell strings CS constituting the two- or three-dimensional array may include memory cells MC1 to MCm, a source select transistor SST, and a drain select transistor DST, which are connected in series.

The memory cells MC1 to MCm connected in series may include a first memory cell MC1, an $m^{th}$ memory cell MCm, and a plurality of memory cells MC2 to MCm−1 between the first memory cell MC1 and the $m^{th}$ memory cell MCm. Gates of the memory cells MC1 to MCm connected in series may be respectively connected to word line WL1 to WLm.

A gate of the source select transistor SST may be connected to a source select line SSL, and a channel of the source select transistor SST may be connected between a channel of the first memory cell MC1 and the common source line CSL. A gate of the drain select transistor DST may be connected to a drain select line DSL, and a channel of the drain select transistor DST may be connected between a corresponding one of the bit lines BL1 to BLn and a channel of the m$^{th}$ memory cell MCm.

As shown in FIG. 3A, the memory cells MC1 to MCm connected in series may be arranged in a line extending in the direction of each of the bit lines BL1 to BLn.

As shown in FIG. 3B, the memory cells MC1 to MCm connected in series may be disposed under a layer in which the bit lines BL1 to BLn are disposed, and be arranged in a line in a vertical direction intersecting the layer in which the bit lines BL1 to BLn are disposed.

As shown in FIG. 3C, the memory cells MC1 to MCm connected in series may be disposed under a layer in which the bit lines BL1 to BLn are disposed, and may be divided and arranged in two or more columns in a vertical direction intersecting the layer in which the bit lines BL1 to BLn are disposed. In an embodiment, the memory cells MC1 to MCm connected in series may include memory cells MC1 to MCk of a first column and memory cells MCm to MCk+1 of second column. The memory cells MC1 to MCk of the first column may include the first memory cell MC1, a k$^{th}$ memory cell MCk, and a plurality of memory cells MC2 to MCk−1 between the first memory cell MC1 and the k$^{th}$ memory cell MCk. The memory cells MCm to MCk+1 of the second column may include the m$^{th}$ memory cell MCm, a (k+1)$^{th}$ memory cell MCk+1, and a plurality of memory cells MCm−1 to MCk+2 between the m$^{th}$ memory cell MCm and the (k+1)$^{th}$ memory cell MCk+1. A channel of a pipe transistor Ptr may be connected in series between a channel of the k$^{th}$ memory cell MCk and a channel of the (k+1)$^{th}$ memory cell MCk+1. A gate of the pipe transistor Ptr may be connected to a pipe gate PG. The memory cells MC1 to MCk of the first column and the memory cells MCm to MCk+1 of the second column may be electrically connected according to a signal applied to the pipe gate PG.

Referring to FIGS. 3A to 3C, the bit lines BL1 to BLm may be formed side by side with each other. Each of the bit lines BL1 to BLm may transfer a signal applied through the page buffer 300 shown in FIG. 2 to a cell string corresponding thereto.

In an embodiment, the first and third to eighth conductive patterns P1 and P3 to P8 shown in FIG. 1A may be patterns extending from the bit lines BL1 to BLn shown in FIG. 3A.

In an embodiment, the first and third to eighth conductive patterns P1 and P3 to P8 shown in FIG. 1A may be patterns extending from the word lines WL1 to WLm shown in FIG. 3A.

In an embodiment, the first and third to eighth conductive patterns P1 and P3 to P8 shown in FIG. 1A may be lines connected to the page buffer 300 shown in FIG. 2.

In an embodiment, the first and third to eighth conductive patterns P1 and P3 to P8 shown in FIG. 1A may be patterns that constitute some of the patterns extending from the bit lines BL1 to BLm shown in any one of FIGS. 3A to 3C and some of the lines connected to the page buffer 300 shown in FIG. 2.

Referring to FIG. 1A, the first and third to eighth conductive patterns P1 and P3 to P8 may be arranged at a minimum pitch that can be implemented through a spacer patterning process. The bending portion BP1 or BP2 may be included in at least some of the first and third to eighth conductive patterns P1 and P3 to P8. Accordingly, a large number of conductive patterns can be disposed within the same area, and the degree of freedom with respect to the layout of connection lines connected to the first and third to eighth conductive patterns P1 and P3 to P8 can be increased. Further, the second conductive pattern P2 is disposed in the closed area CA defined by the first line portion LP1 and the first bending portion BP1, and is used as a contact plug, so that the degree of freedom is increased with respect to the layout of lines arranged above or under the layer in which the first and third to eighth conductive patterns P1 and P3 to P8 are disposed.

The first to eighth conductive patterns P1 to P8 shown in FIG. 1A may be formed using process steps shown in FIGS. 4A to 4C, 5A to 5C, 6, 7A to 7C, 8A to 8C, 9A to 9C, and 10A to 10C.

Figure 4A:
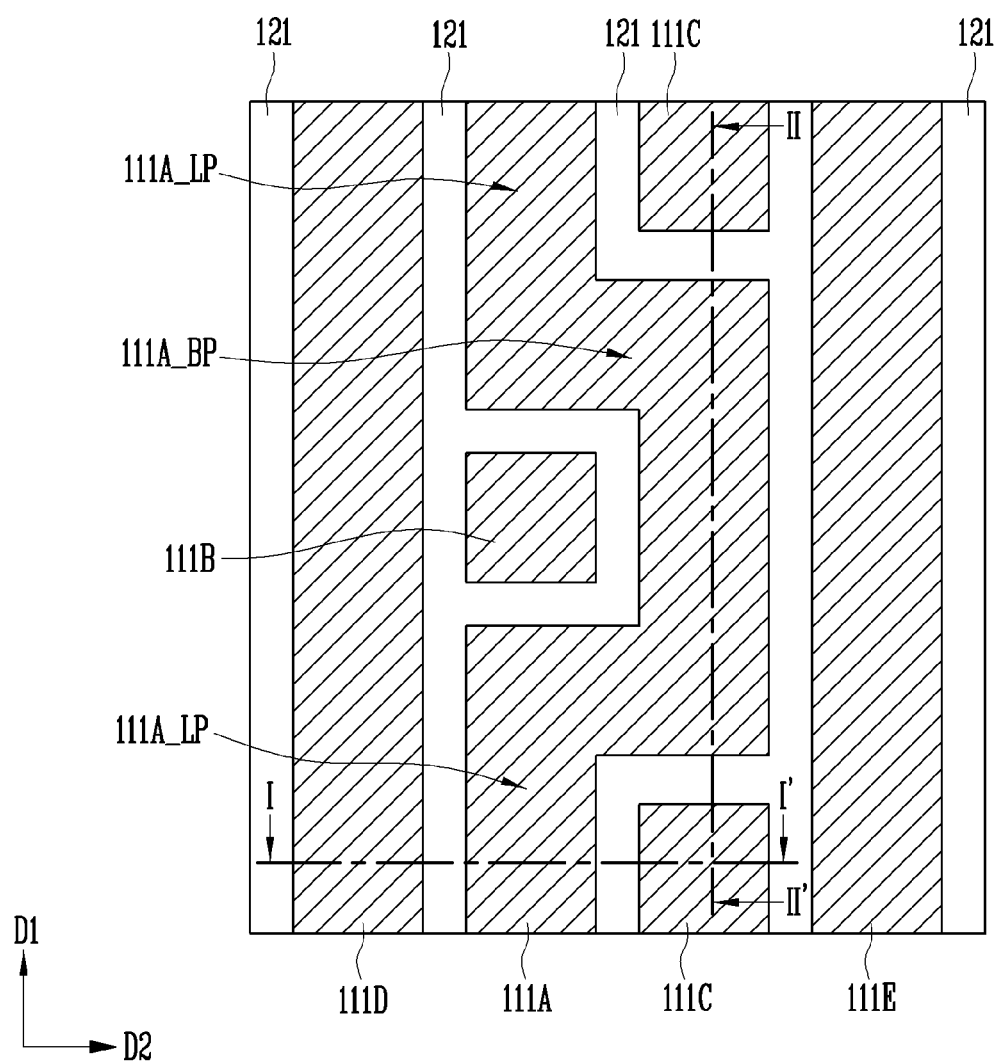
Figure 4B:
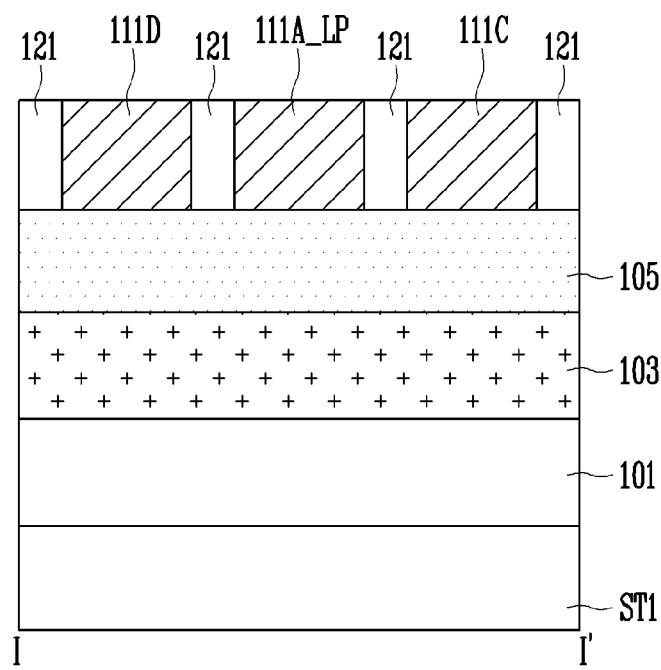
Figure 4C:
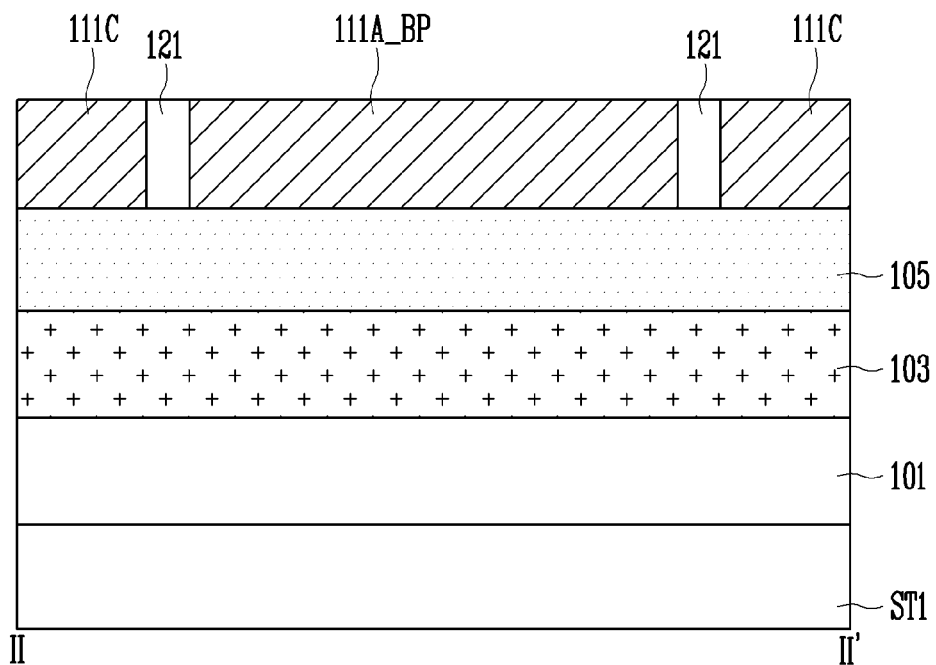

FIGS. 4A to 4C are views illustrating a process of forming preliminary mask patterns 111A to 111E and preliminary spacers 121, according to an embodiment of the present disclosure. FIG. 4A is a plan view illustrating a layout of the preliminary mask patterns 111A to 111E and the preliminary spacers 121, FIG. 4B is a sectional view taken along line I-I' shown in FIG. 4A, and FIG. 4C is a sectional view taken along line II-II' shown in FIG. 4A.

Referring to FIGS. 4A to 4C, after the first structure ST1 described for FIG. 1B is formed on a substrate (not shown), a target layer may be formed on the first structure ST1. Subsequently, after the target layer is formed, an auxiliary layer 105 may be formed on the target layer. The target layer may include an insulating layer 101 stacked on the first structure ST1 and a mask layer 103 stacked on the insulating layer 101.

The insulating layer 101 may be formed of an oxide, such as a silicon oxide layer. The mask layer 103 may include a material having an etch rate different from that of the insulating layer 101. The auxiliary layer 105 may include a material having an etch rate different from that of the mask layer 103. In other words, the mask layer 103 and the auxiliary layer 105 may be formed of different materials. Each of the mask layer 103 and the auxiliary layer 105 may include at least one of an amorphous carbon layer, a nitride layer, and a poly silicon layer.

Subsequently, preliminary mask patterns 111A to 111E, spaced apart from each other, may be formed on the auxiliary layer 105. For an embodiment, the preliminary mask patterns 111A to 111E may be formed with the same line width, and may be spaced apart from each other at the same distance. The line width of each of the preliminary mask patterns 111A to 111E may be formed wider than that of each of the first to eighth conductive patterns P1 to P8 shown in FIG. 1. For example, the line width of each of the preliminary mask patterns 111A to 111E may be three times of that of each of the first to eighth conductive patterns P1 to P8 shown in FIG. 1.

The preliminary mask patterns 111A to 111E may be formed using a photolithography process. The preliminary mask patterns 111A to 111E may be formed of a material having an etch rate different from that of preliminary spacers 121 formed in a subsequent process. For example, the preliminary mask patterns 111A to 111E may be photoresist patterns.

The preliminary mask patterns 111A to 111E may include at least one first preliminary mask pattern 111A including a bending portion 111A_BP. The first preliminary mask pattern 111A may include the bending portion 111A_BP and line portions 111A_LP extending from both ends of the bending portion 111A_BP. Each of the line portions 111A_LP may have a linear shape extending in a first direction D1. The line portions 111A_LP may be aligned in a line on a straight line extending in the first direction D1. The line portions 111A_LP may extend in opposite directions from both ends of the bending portion 111A_BP, and are spaced apart from each other in the first direction D1. The bending portion 111A_BP may have a shape bent at a right angle.

The preliminary mask patterns 111A to 111E may include at least one second preliminary mask pattern 111B. The second preliminary mask pattern 111B is disposed between the line portions 111A_LP. The bending portion 111A_BP may partially surround a side portion of the second preliminary mask pattern 111B while being spaced apart from the second preliminary mask pattern 111B. The second preliminary mask pattern 111B may be formed in a quadrangular shape, and the bending portion 111A_BP may have a shape bent at a right angle to be parallel to three surfaces of the second preliminary mask pattern 111B having the quadrangular shape. The second preliminary mask pattern 111B and the line portions 111A_LP may be aligned on a straight line extending in the first direction D1.

The preliminary mask patterns 111A to 111E may include at least one pair of third preliminary mask patterns 111C. The third preliminary mask patterns 111C may be disposed to be spaced apart from the line portions 111A_LP in a second direction D2. Each of the third preliminary mask patterns 111C may have a linear shape extending in the first direction D1. The third preliminary mask patterns 111C may be aligned in a line extending in the first direction D1. The third preliminary mask patterns 111C may extend in opposite directions with the bending portion 111A_BP interposed therebetween.

The preliminary mask patterns 111A to 111E may further include a fourth preliminary mask pattern 111D and a fifth preliminary mask pattern 111E. Each of the fourth preliminary mask pattern 111D and the fifth preliminary mask pattern 111E may have a linear shape extending in the first direction D1. The second preliminary mask pattern 111B and the line portions 111A_LP of the first preliminary mask pattern 111A may be spaced apart from the fourth preliminary mask pattern 111D in the second direction D2. The fifth preliminary mask pattern 111E may be spaced apart from the third preliminary mask patterns 111C in the second direction D2. According to the above-described arrangement, the first to third preliminary mask patterns 111A to 111C are disposed between the fourth preliminary mask pattern 111D and the fifth preliminary mask pattern 111E.

Subsequently, preliminary spacers 121 are formed on sidewalls of the preliminary mask patterns 111A to 111E. The preliminary spacers 121 may fill spaces between the preliminary mask patterns 111A to 111E. The process of forming the preliminary spacers 121 may include a process of forming a preliminary spacer layer on the auxiliary layer 105 on which the preliminary mask patterns 111A to 111E are formed and a process of performing anisotropic etching on the preliminary spacer layer such that a top surface of each of the preliminary mask patterns 111A to 111E is exposed. The preliminary spacer layer may be formed of a material having an etch rate different from those of the auxiliary layer 105 and the preliminary mask patterns 111A to 111E. For example, the preliminary spacer layer may be formed of an oxide layer.

Figure 5B:
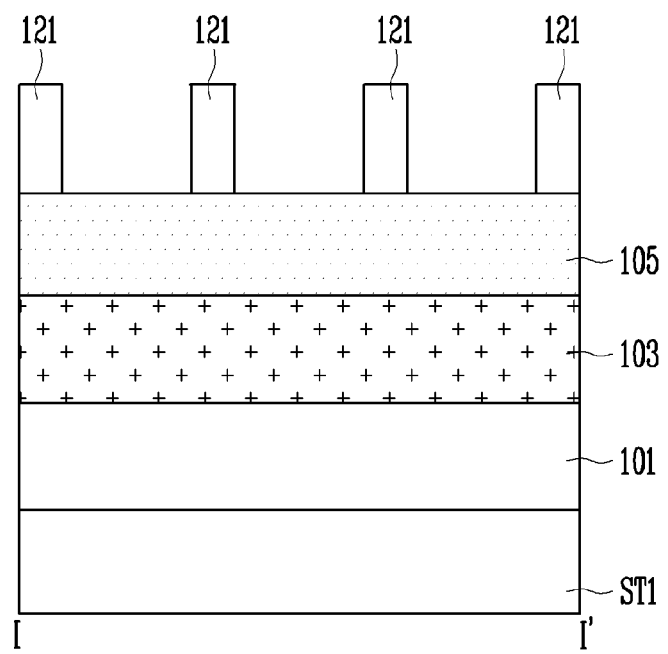
Figure 5C:
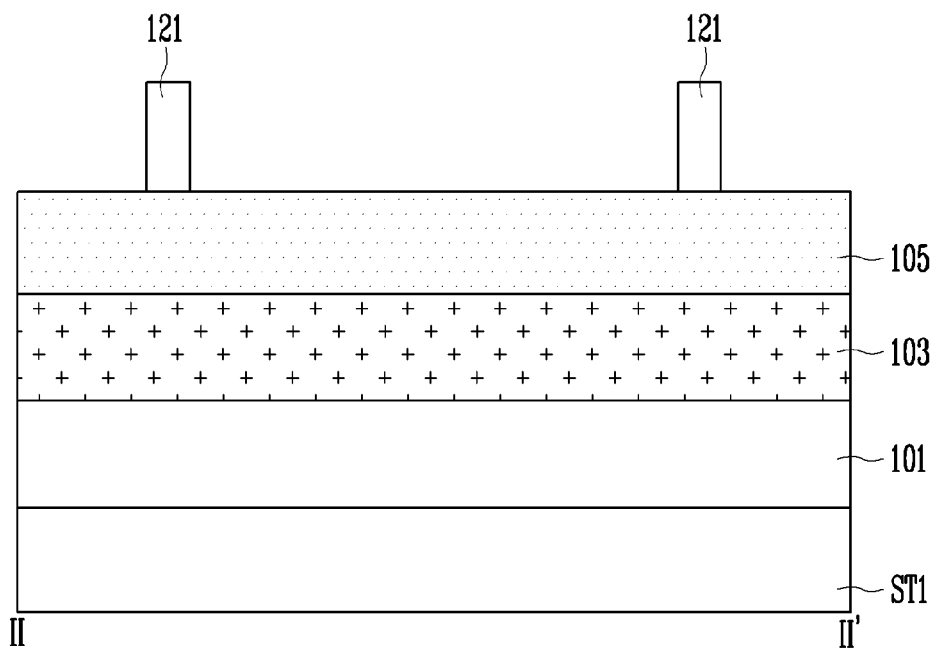

FIGS. 5A to 5C are views illustrating a process of removing the preliminary mask patterns 111A to 111E, according to an embodiment of the present disclosure. FIG. 5A is a plan view illustrating a layout of remaining preliminary spacers 121, FIG. 5B is a sectional view taken along line I-I' shown in FIG. 5A, and FIG. 5C is a sectional view taken along line II-II' shown in FIG. 5A.

Referring to FIGS. 5A to 5C, the preliminary mask patterns 111A to 111E shown in FIGS. 4A to 4C may be selectively removed. Therefore, the auxiliary layer 105 may be exposed through opening spaces between the preliminary spacers 121. The shapes of the opening spaces may be identical to those of the preliminary mask patterns 111A to 111E.

Figure 6:
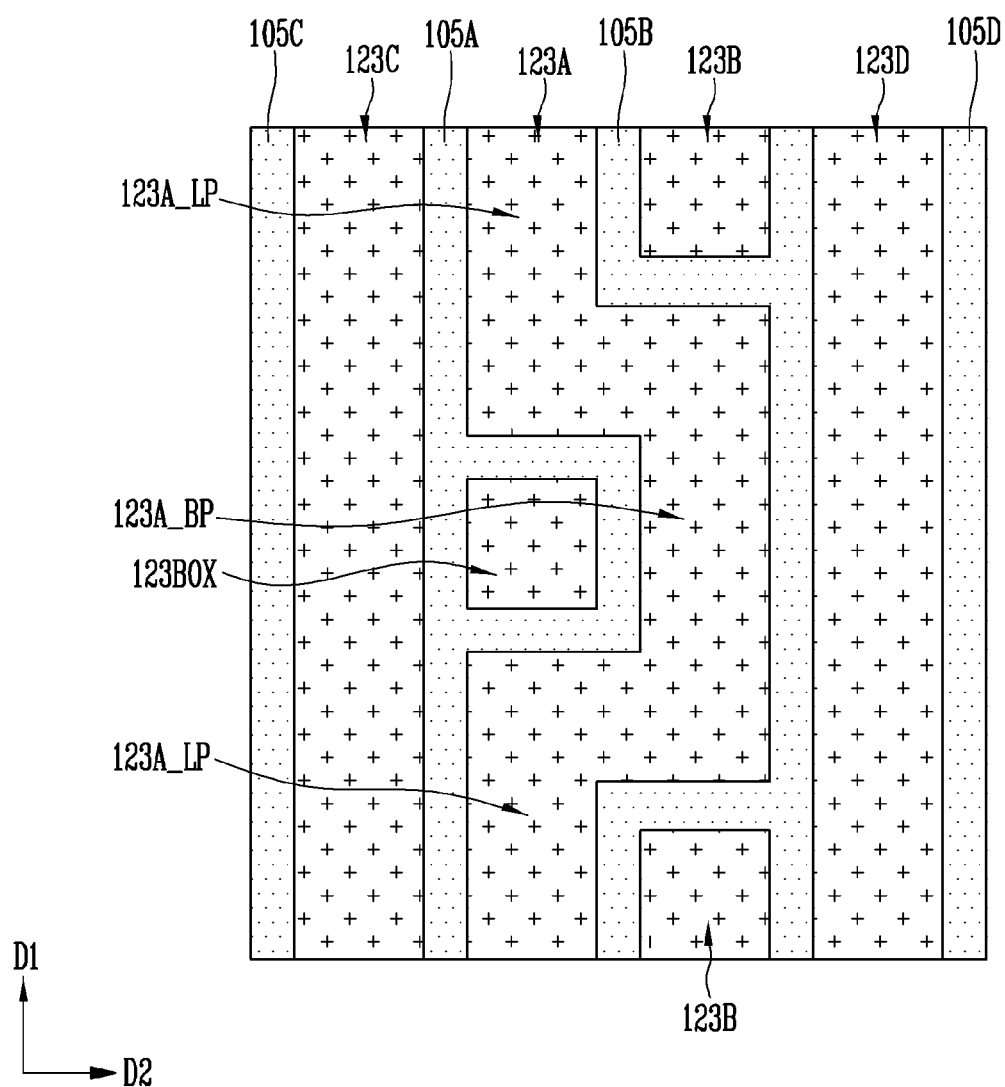

FIG. 6 is a plan view illustrating a method of forming auxiliary patterns 105A to 105D, according to an embodiment of the present disclosure.

Referring to FIG. 6, the auxiliary patterns 105A to 105D may be formed by etching the auxiliary layer 105 through an etching process using the preliminary spacers 121 shown in FIGS. 5A to 5C as an etching barrier. After the auxiliary patterns 105A to 105D are formed, the preliminary spacers 121 may be removed. The auxiliary patterns 105A to 105D may be formed in the same shapes as the preliminary spacers 121 shown in FIGS. 5A to 5C. The auxiliary patterns 105A to 105D may be spaced apart from each other.

The auxiliary patterns 105A to 105D may include a first auxiliary pattern 105A and a second auxiliary pattern 105B. The first auxiliary pattern 105A may surround a box area 123BOX. The second auxiliary pattern 105B may be spaced apart from the first auxiliary pattern 105A in the second direction D2. A first trench 123A may be disposed between the first auxiliary pattern 105A and the second auxiliary pattern 105B.

The first trench 123A may have the same shape as the first preliminary mask pattern 111A shown in FIG. 4A. The first trench 123A may include a pair of first portions 123A_LP and a second portion 123A_BP connected between the first portions 123A_LP. Each of the first portions 123A_LP may extend in the first direction D1, and the first portions 123A_LP may be aligned on a straight line extending in the first direction D1. The second portion 123A_BP may protrude in the second direction D2 from end portions of the first portions 123A_LP, which face each other, and be formed in a bent shape. In other words, the first portions 123A_LP may extend in opposite directions from both ends of the bent second portion 123A_BP. The second portion 123A_BP may have a shape bent at a right angle.

The box area 123BOX surrounded by the first auxiliary pattern 105A may have the same shape as the second preliminary mask pattern 111B shown in FIG. 4A. The box area 123BOX may be disposed between the first portions 123A_LP of the first trench 123A. The box area 123BOX may be formed in a quadrangular shape along the appearance of the second portion 123A_BP bent at the right angle. The box area 123BOX and the first portions 123A_LP of the first trench 123A may be aligned on a straight line extending in the first direction D1.

The second auxiliary pattern 105B may be penetrated by at least one pair of second trenches 123B. The second trenches 123B may be formed as the same shape as the third preliminary mask patterns 111C shown in FIG. 4A. The second trenches 123B may extend in parallel to the first portions 123A_LP of the first trench 123A. The second trenches 123B may be spaced apart from each other in the first direction D1, and the second portion 123A_BP of the first trench 123A may be disposed between the second trenches 123B. The second trenches 123B may be spaced apart from the first trench 123A by the second auxiliary pattern 105B. Each of the second trenches 123B may have a linear shape extending in the first direction D1. The second trenches 123B may be aligned on a straight line extending in the first direction D1. The second trenches 123B may extend in opposite directions with the second portion 123A_BP interposed therebetween.

The auxiliary patterns 105A to 105D may further include a third auxiliary pattern 105C and a fourth auxiliary pattern 105D. The first auxiliary pattern 105A may be spaced apart from the third auxiliary pattern 105C in the second direction D2, and the fourth auxiliary pattern 105D may be spaced apart from the second auxiliary pattern 105B in the second direction D2. A third trench 123C extending in the first direction D1 may be disposed between the first auxiliary pattern 105A and the third auxiliary pattern 105C, and a fourth trench 123D extending in the first direction D1 may be disposed between the second auxiliary pattern 105B and the fourth auxiliary pattern 105D.

The third trench 123C may be formed in the same shape as the fourth preliminary mask pattern 111D shown in FIG. 4A. The third trench 123C is spaced apart from the box area 123BOX and the first portions 123A_LP of the first trench 123A by the first auxiliary pattern 105A.

The fourth trench 123D may be formed in the same shape as the fifth preliminary mask pattern 111E shown in FIG. 4A. The fourth trench 123D is spaced apart from the second portion 123A_BP of the first trench 123A and the second trenches 123B by the second auxiliary pattern 105B.

Figure 7A:
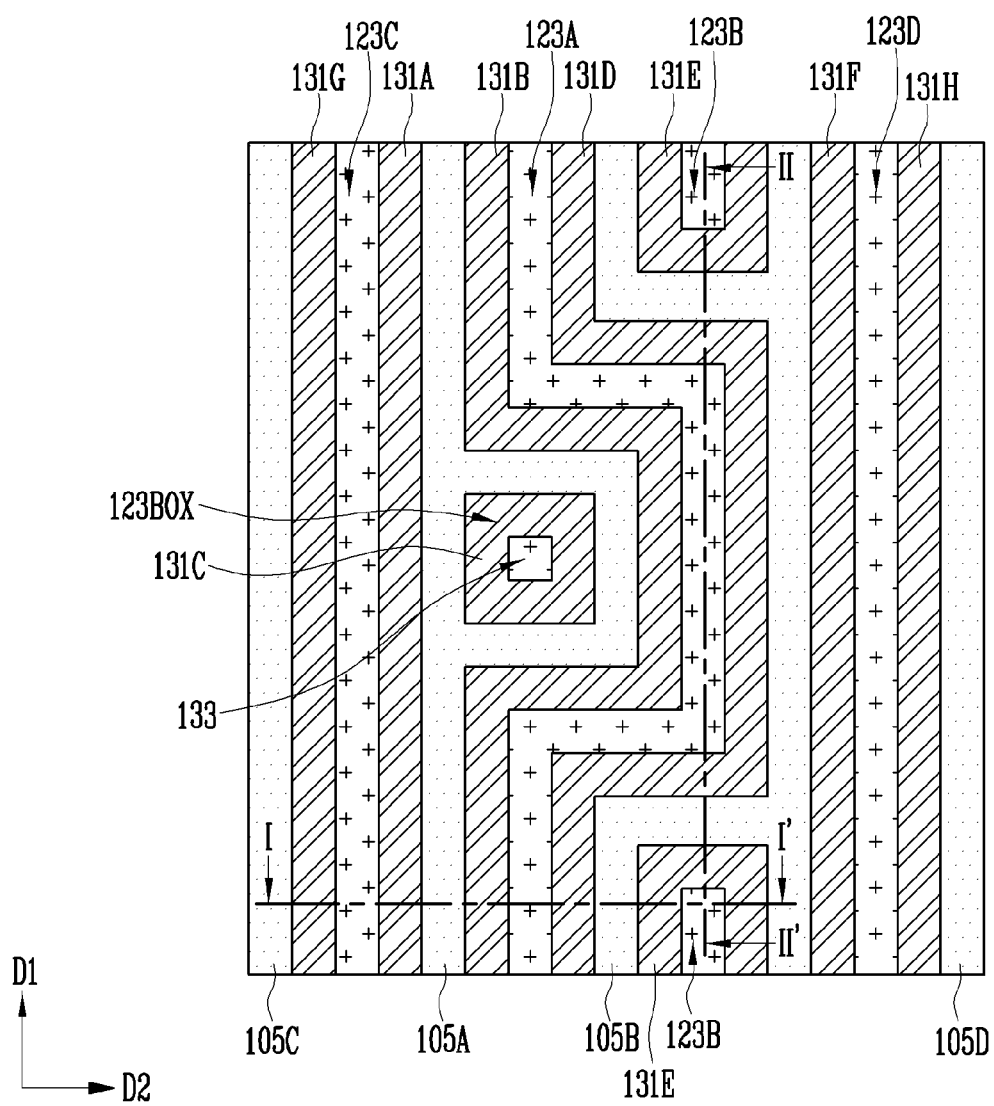
Figure 7B:
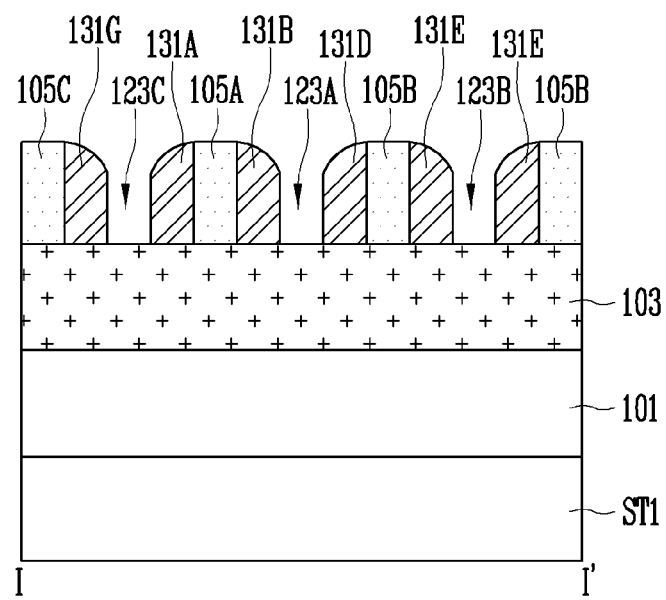
Figure 7C:
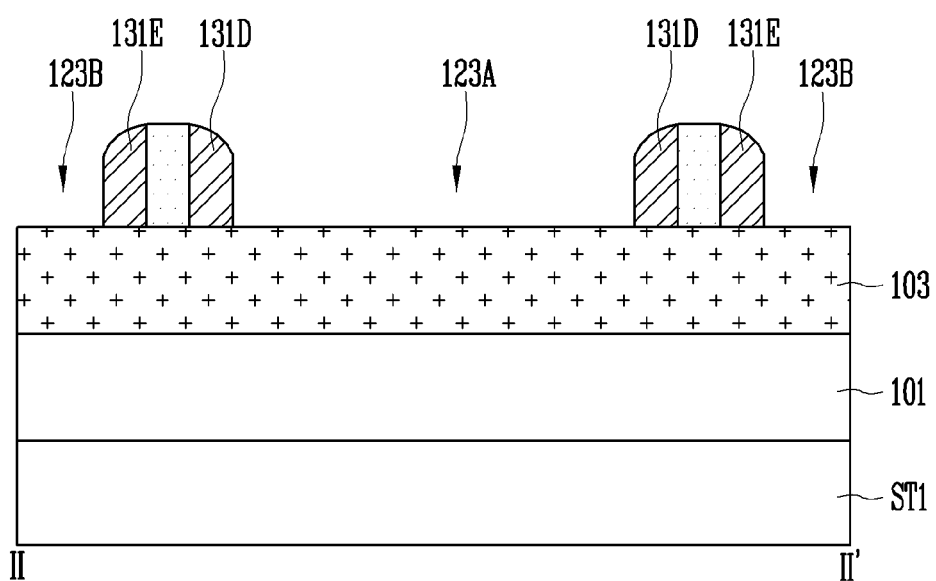

FIGS. 7A to 7C are views illustrating a process of forming spacers 131A to 131H, according to an embodiment of the present disclosure. FIG. 7A is a plan view illustrating a layout of the spacers 131A to 131H, FIG. 7B is a sectional view taken along line I-I' shown in FIG. 7A, and FIG. 7C is a sectional view taken along line II-II' shown in FIG. 7A.

Referring to FIGS. 7A to 7C, spacers 131A to 131H are formed on sidewalls of the auxiliary patterns 105A to 105D. The spacers 131A to 131H may be open center areas of the first to fourth trenches 123A to 123D and a center area of the box area 123BOX. The process of forming the spacers 131A to 131H may include a process of conformally forming a spacer layer on the insulating layer 101 on which the auxiliary patterns 105A to 105D are formed and a process of performing anisotropic etching on the spacer layer such that a top surface of each of the auxiliary patterns 105A to 105D is exposed. The thickness of the spacer layer may be controlled such that each of the center areas of the first to fourth trenches 123A to 123D and the center area of the box area 123BOX are opened. Hereinafter, the opened center area of the box area 123BOX is defined as a closed area 133. The spacer layer for the spacers 131A to 131H may include a material having an etch rate different from those of the auxiliary patterns 105A to 105D and the mask layer 103. For example, the spacer layer may be formed of an oxide layer.

The line width of each of the spacers 131A to 131H may be equal to that of each of the auxiliary patterns 105A to 105D. The line width of each of the spacers 131A to 131H may be ⅓ of that of each of the first to fourth trenches 123A to 123D.

Figure 8A:
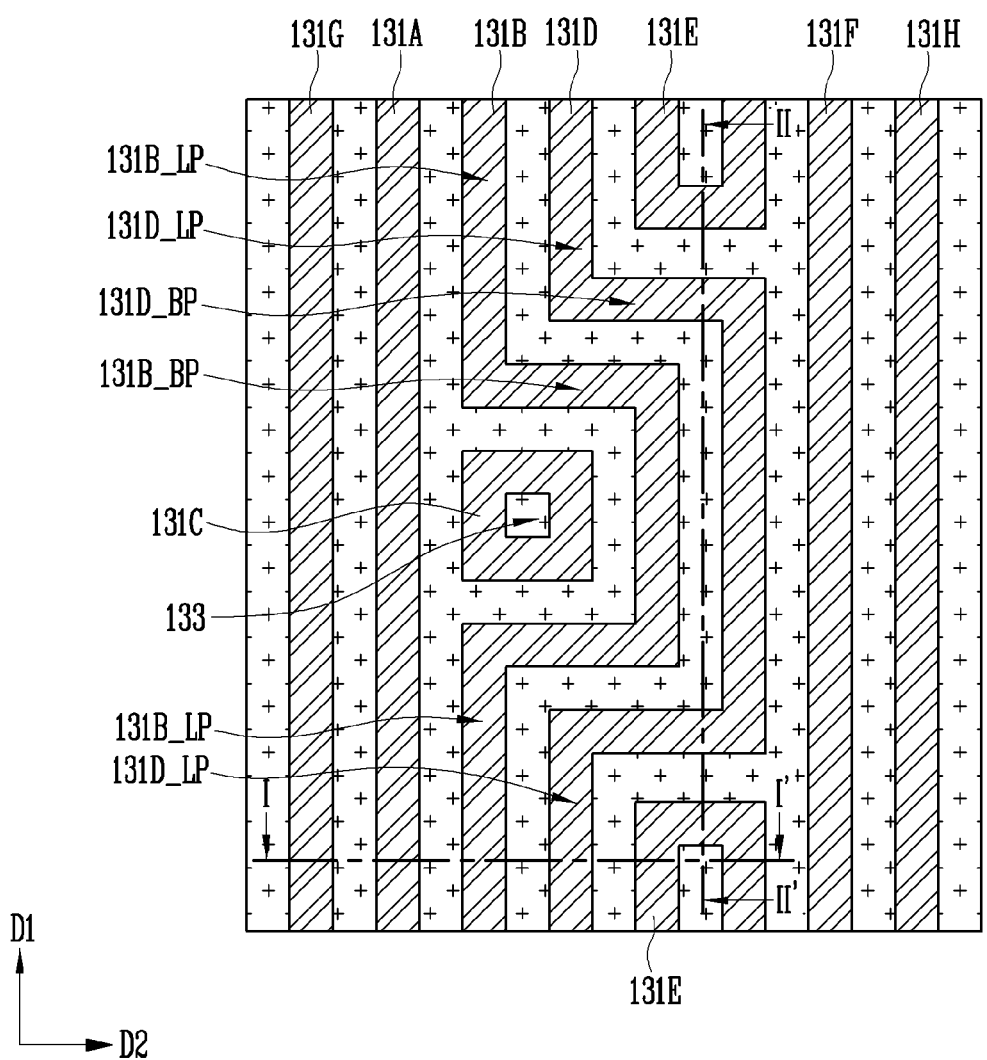
Figure 8B:
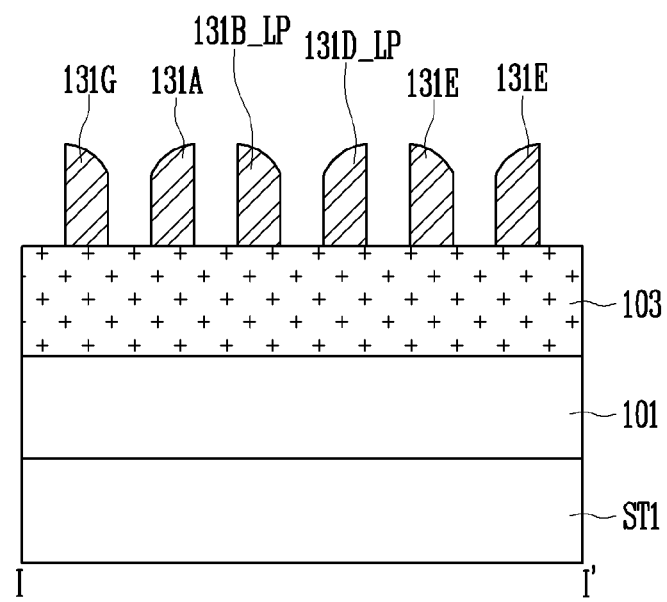
Figure 8C:
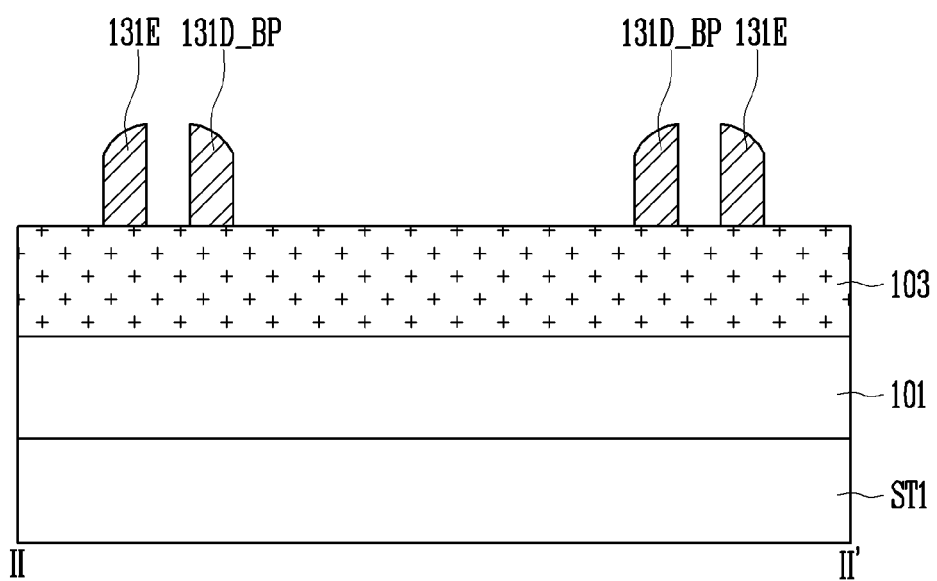

FIGS. 8A to 8C are views illustrating a process of removing the auxiliary patterns 105A to 105D, according to an embodiment of the present disclosure. FIG. 8A is a plan view illustrating a layout of remaining spacers 131A to 131H, FIG. 8B is a sectional view taken along line I-I' shown in FIG. 8A, and FIG. 8C is a sectional view taken along line II-II' shown in FIG. 8A.

Referring to FIGS. 8A to 8C, the auxiliary patterns 105A to 105D shown in FIGS. 7A to 7C may be selectively removed. Therefore, the mask layer 103 may be exposed through opening spaces between the spacers 131A to 131B.

The spacers 131A to 131H may include first to third spacers 131A to 131C. As shown in FIG. 7A, the first spacer 131A may be formed on a first sidewall of the first auxiliary pattern 105A facing the third trench 123C. As shown in FIG. 7A, the second spacer 131B may be formed on a second sidewall of the first auxiliary pattern 105A facing the first trench 123A. As shown in FIG. 7A, the third spacer 131C may be formed on a sidewall of the box area 123BOX to surround the closed area 133. When the area in which the first auxiliary pattern 105A shown in FIGS. 7A to 7C is removed is defined as a first recess area, the first to third spacers 131A to 131C may be spaced apart from each other by the first recess area.

Referring to FIGS. 8A to 8C, the first spacer 131A may have a linear shape extending in the first direction D1. The second spacer 131B may have at least one pair of first line portions 131B_LP and a first bending portion 131B_BP. Each of the first line portions 131B_LP may extend in parallel to the first spacer 131A. The first line portions 131B_LP may be spaced apart from each other in the first direction D1, and be aligned in a line on a straight line extending in the first direction D1. The first bending portion 131B_BP may protrude in the second direction D2 from end portions of the first line portions 131B_LP, which face each other in the first direction D1, and have a bent shape. The first bending portion 131B_BP may be bent at a right angle. The third spacer 131C may surround the circumference of the closed area 133 between the first line portions 131B_LP. The third spacer 131C may be disposed between the first line portions 131B_LP, and be spaced apart from the first spacer 131A in the second direction D2. One sidewall of the third spacer 131C, which faces the first spacer 131A, may be parallel to the first spacer 131A. The other sidewall of the third spacer 131C, which faces the first bending portion 131B_BP, may extend in parallel to the first bending portion 131B_BP. The closed area 133 may be formed in a quadrangular shape.

The spacers 131A to 131H may further include a fourth spacer 131D, at least one pair of fifth spacers 131E, and a sixth spacer 131F. As shown in FIG. 7A, the fourth spacer 131D may be formed on a third sidewall of the second auxiliary pattern 105B, which faces the first trench 123A. As shown in FIG. 7A, the fifth spacers 131E may be formed on sidewalls of the second trenches 123B. As shown in FIG. 7A, the sixth spacer 131F may be formed on a fourth sidewall of the second auxiliary pattern 105B, which faces the fourth trench 123D. When the area in which the second auxiliary pattern 105B shown in FIGS. 7A to 7C is removed is defined as a second recess area, the fourth spacer 131D, the fifth spacers 131E, and the sixth spacer 131F may be spaced apart from each other by the second recess area.

Referring to FIGS. 8A to 8C, the fourth spacer 131D may extend in parallel to the second spacer 131B. The fourth spacer 131D may have at least one pair of second line portions 131D_LP and a second bending portion 131D_BP. The second line portions 131D_LP may extend in parallel to the first line portions 131B_LP. The second line portions 131D_LP may be spaced apart from each other in the first direction D1, and be aligned in a line on a straight line extending in the first direction D1. The second bending portion 131D_BP may protrude in the second direction D2 from end portions of the second line portions 131D_LP, which face each other in the first direction D1, and have a bent shape. The second bending portion 131D_BP may be bent at a right angle. The second bending portion 131D_BP may extend in parallel to the first bending portion 131B_BP. The sixth spacer 131F may extend in parallel to the first spacer 131A.

The spacers 131A to 131H may further include a seventh spacer 131G and an eighth spacer 131H. As shown in FIG. 7A, the seventh spacer 131G may be formed on a sidewall of the third auxiliary pattern 105C. As shown in FIG. 7A, the eighth spacer 131H may be formed on a sidewall of the fourth auxiliary pattern 105D. When the area in which the third auxiliary pattern 105C shown in FIGS. 7A to 7C is removed is defined as a third recess region, the mask layer 103 may be opened at both sides of the seventh spacer 131G. When the area in which the fourth auxiliary pattern 105D shown in FIGS. 7A to 7C is removed is defined as a fourth recess region, the mask layer 103 may be opened at both sides of the eighth spacer 131H.

Each of the seventh spacer 131G and the eighth spacer 131H may have a linear shape extending in parallel to the first spacer 131A.

Figure 9A:
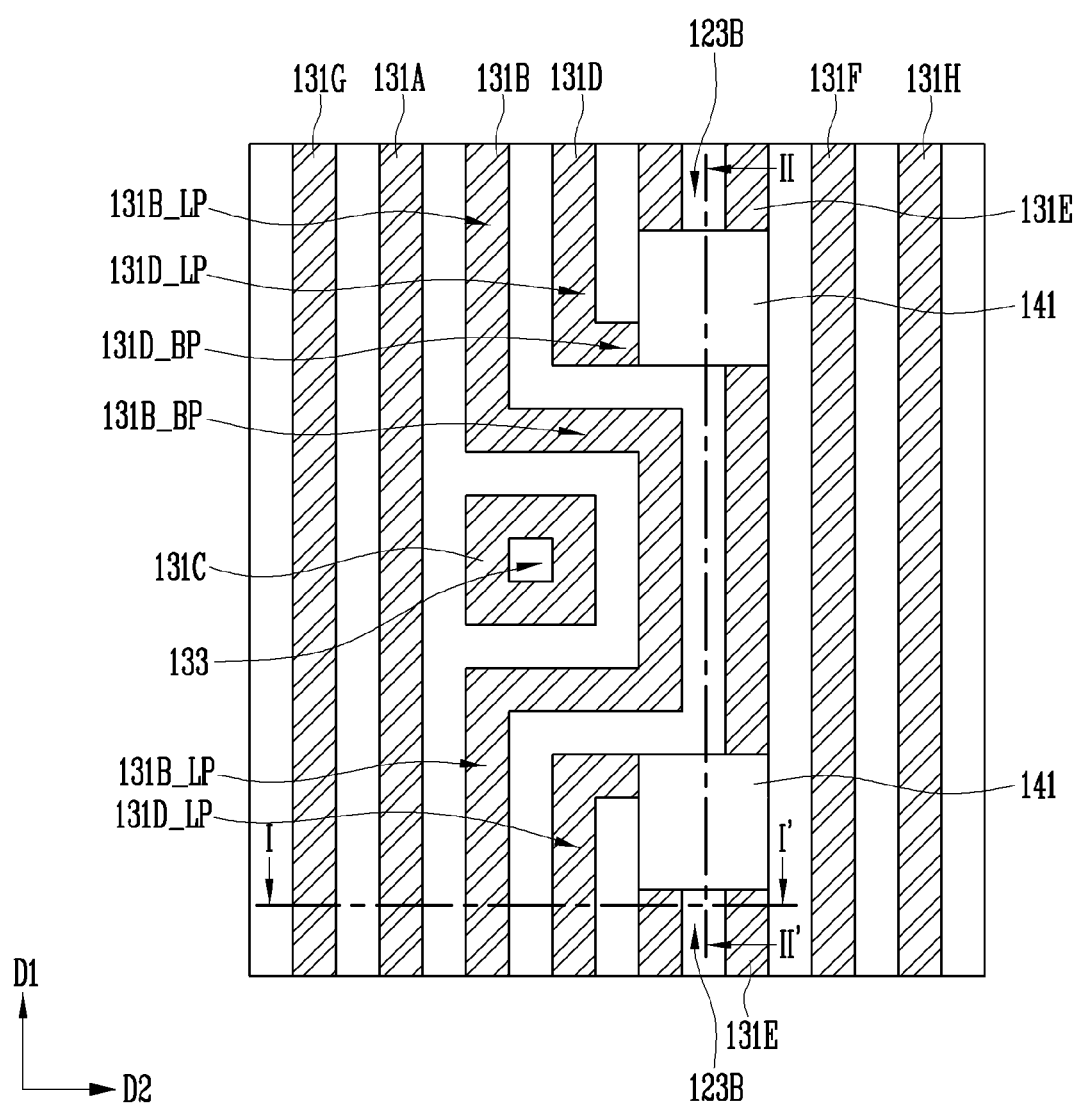
Figure 9B:
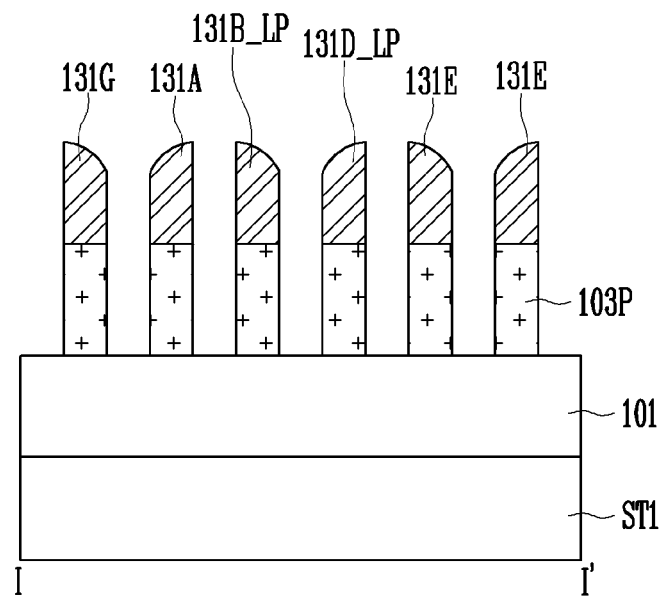
Figure 9C:
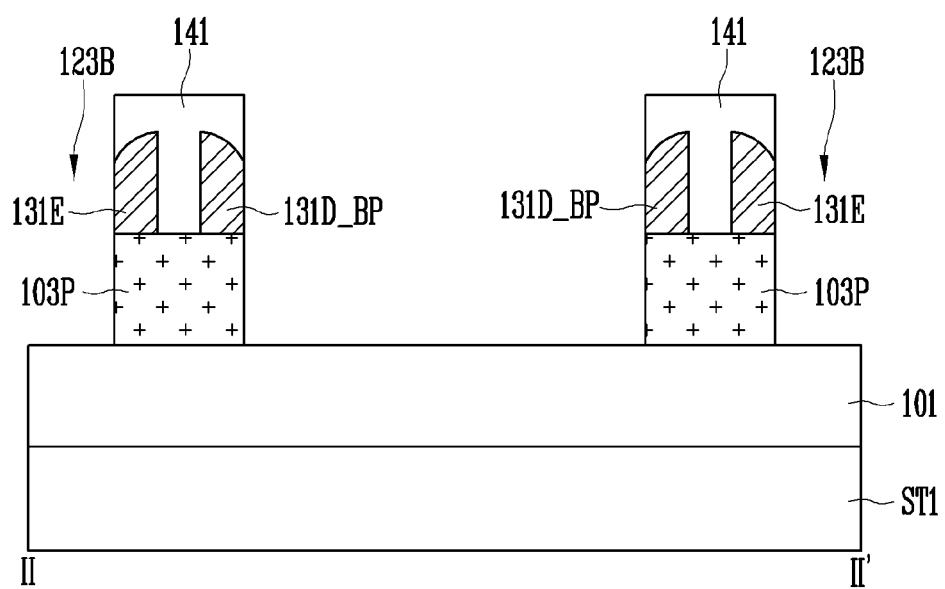

FIGS. 9A to 9C are views illustrating a process of forming pad mask patterns 141 and a process of forming mask patterns 103P according to an embodiment of the present disclosure. FIG. 9A is a plan view illustrating a layout of the pad mask patterns 141 and the spacers 131A to 131H, FIG. 9B is a sectional view taken along line I-I' shown in FIG. 9A, and FIG. 9C is a sectional view taken along line II-II' shown in FIG. 9A.

Referring to FIGS. 9A to 9C, pad mask patterns 141 that respectively block spaces between the fifth spacers 131E and the second bending portion 131D_BP may be formed. The pad mask patterns 141 may be formed using a photolithography process.

The pad mask patterns 141 may include a material having an etch rate different from that of the mask layer 103 shown in FIGS. 8B and 8C. For example, the pad mask patterns 141 may be formed of an oxide layer.

The center areas of the second trenches 123B described with reference to FIG. 6 are not filled with the fifth spacers 151E but may be opened. In addition, the second trenches 123B may respectively include areas that are not covered by the pad mask patterns 141 but opened. The spacers 131A to 131H according to an embodiment of the present disclosure have line widths defined by the SPT, and are spaced apart from each other by distances defined by the SPT. The line widths and the distances, which are defined by the SPT, may be formed as minimum pitches that are available in a manufacturing process of the semiconductor device. According to an embodiment of the present disclosure, an overlay margin of the pad mask patterns 141 formed through the photolithography process may be increased by the second bending portion 131D_BP. Thus, according to an embodiment of the present disclosure, an alignment error of the pad mask patterns 141 can be reduced, and accordingly, the stability in the manufacturing process of the semiconductor device can be improved.

Subsequently, mask patterns 103P are formed by etching opening areas of the mask layer 103 that are not blocked by the pad mask patterns 141 and the spacers 131A to 131H.

Figure 10A:
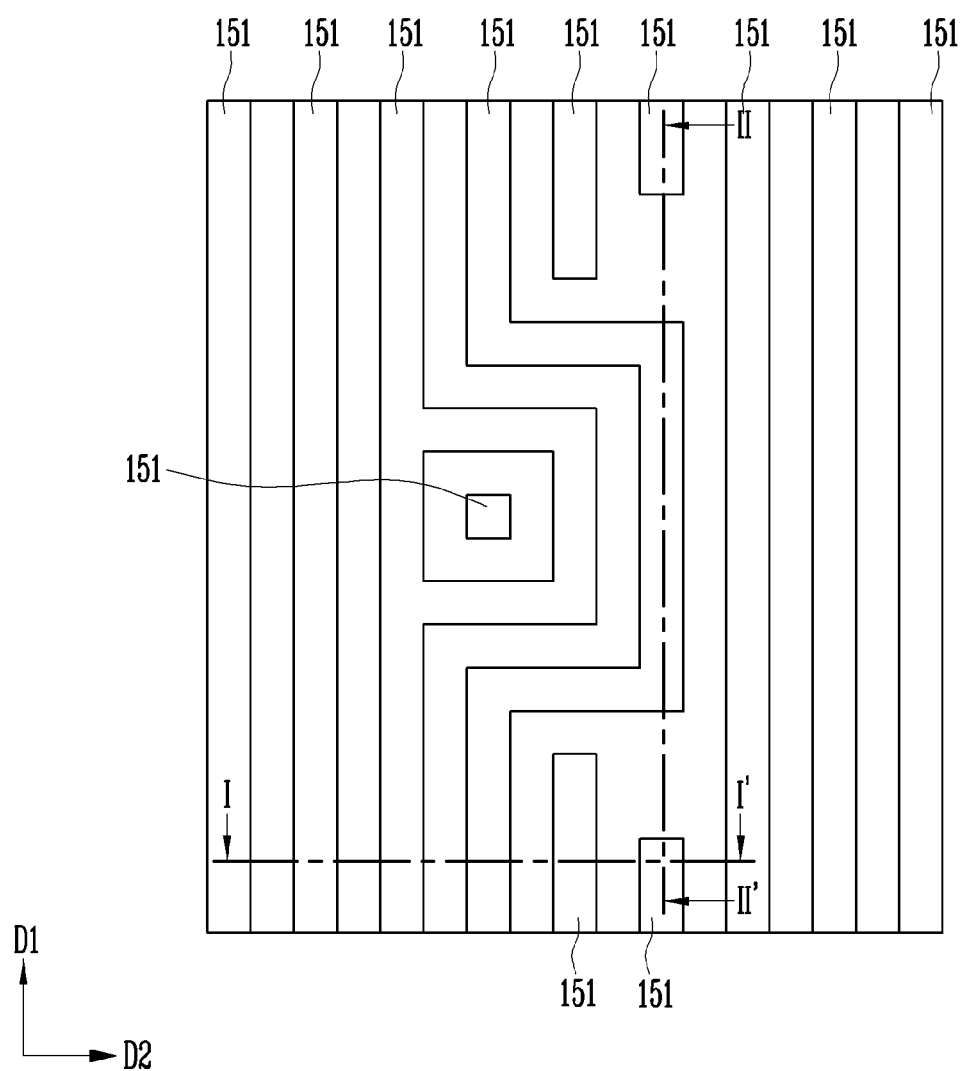
Figure 10B:
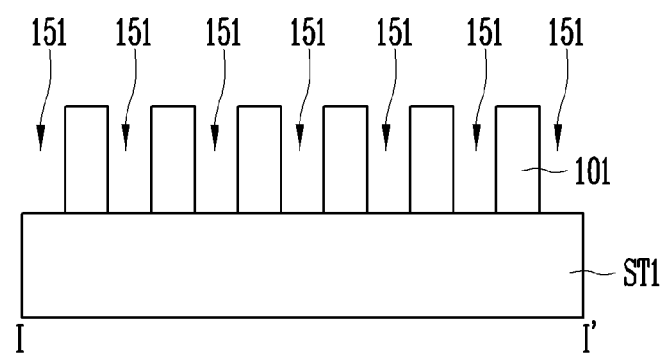
Figure 10C:
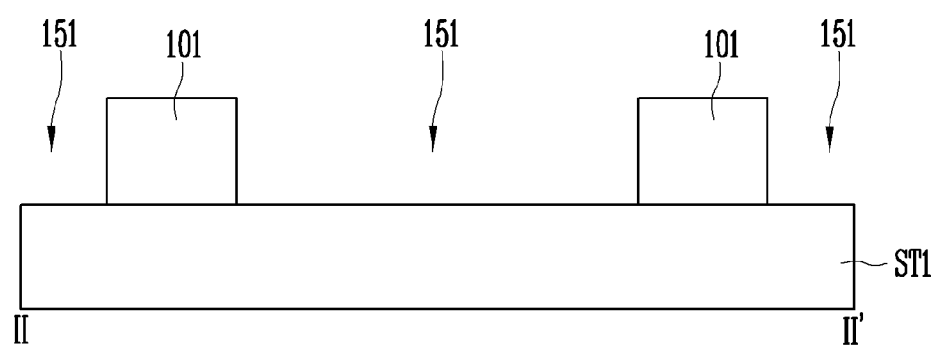

FIGS. 10A to 10C are views illustrating a process of forming recess areas 151 according to an embodiment of the present disclosure. FIG. 10A is a plan view illustrating a layout of the recess areas 151, FIG. 10B is a sectional view taken along line I-I' shown in FIG. 10A, and FIG. 10C is a sectional view taken along line II-II' shown in FIG. 10A.

Referring to FIGS. 10A to 10C, opening areas of the insulating layer 101, which are opened by the mask patterns 103P shown in FIGS. 9B and 9C, are etched. Therefore, recess areas 151 may be defined in the areas in which the insulating layer 101 is etched. The pad mask patterns 141 and the spacers 131A to 131H, which are shown in FIGS. 9A to 9C, may be removed after the mask patterns 103P are formed. The mask patterns 103P shown in FIGS. 9B and 9C may be removed after the recess areas 151 are formed.

Subsequently, as shown in FIG. 1A, the recess areas 151 shown in FIG. 10A may be filled with the conductive patterns P1 to P8.

According to the present disclosure, the second conductive pattern spaced apart from the first conductive pattern is disposed in the closed area surrounded by the first conductive pattern. Thus, the second conductive pattern can be used as a contact plug. Accordingly, the degree of freedom of lines can be increased, and the complexity of lines can be improved.

Figure 11:
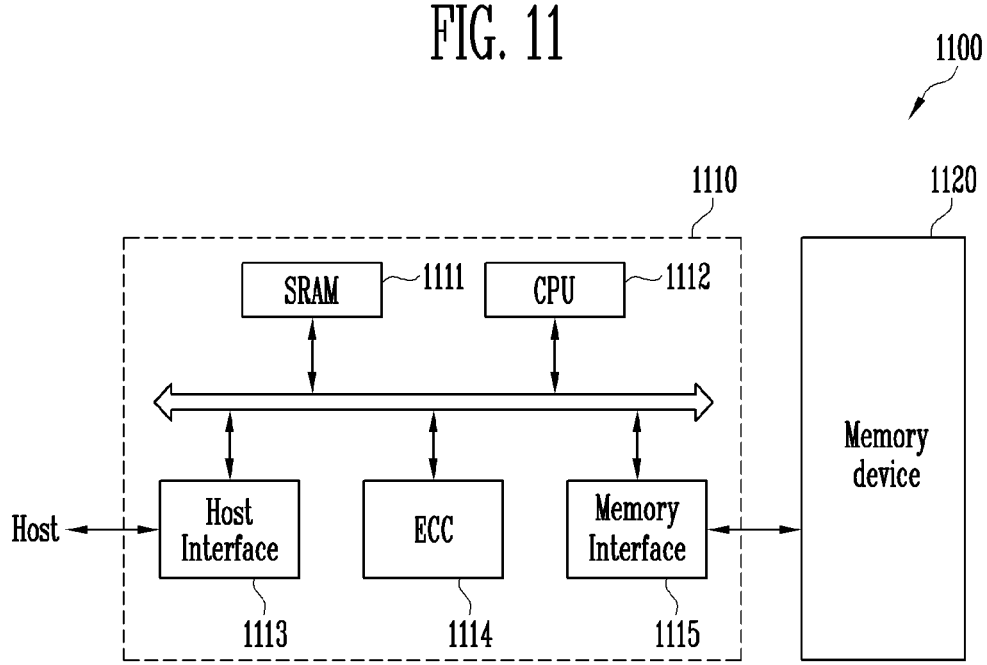
FIG. 11 is a block diagram illustrating a configuration of a memory system, according to an embodiment of the present disclosure.

FIG. 11 is a block diagram illustrating a configuration of a memory system according to an embodiment of the present disclosure.

Referring to FIG. 11, the memory system 1100 according to the embodiment of the present disclosure includes a memory device 1120 and a memory controller 1110.

The memory controller 1110 is configured to control the memory device 1120, and may include a static random access memory (SRAM) 1111, a CPU 1112, a host interface 1113, an error correction code circuit (ECC) 1114, and a memory interface 1115. The SRAM 1111 is used as an operation memory of the CPU 1112, the CPU 1112 performs overall control operations for data exchange of the memory controller 1110, and the host interface 1113 includes a data exchange protocol for a host connected with the memory system 1100. The ECC 1114 detects and corrects an error included in a data read from the memory device 1120, and the memory interface 1115 interfaces with the memory device 1120. In addition, the memory controller 1110 may further include an ROM for storing code data for interfacing with the host, and the like.

The memory system 1100 configured as described above may be a memory card or a Solid State Disk (SSD), in which the memory device 1120 is combined with the controller 1110. For example, when the memory system 1100 is an SSD, the memory controller 1100 may communicated with the outside (e.g., the host) through one among various interface protocols, such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (PATA) protocol, a Small Computer System Interface (SCSI) protocol, an Enhanced Small Disk Interface (ESDI) protocol, and an Integrated Drive Electronics (IDE) protocol.

Figure 12:
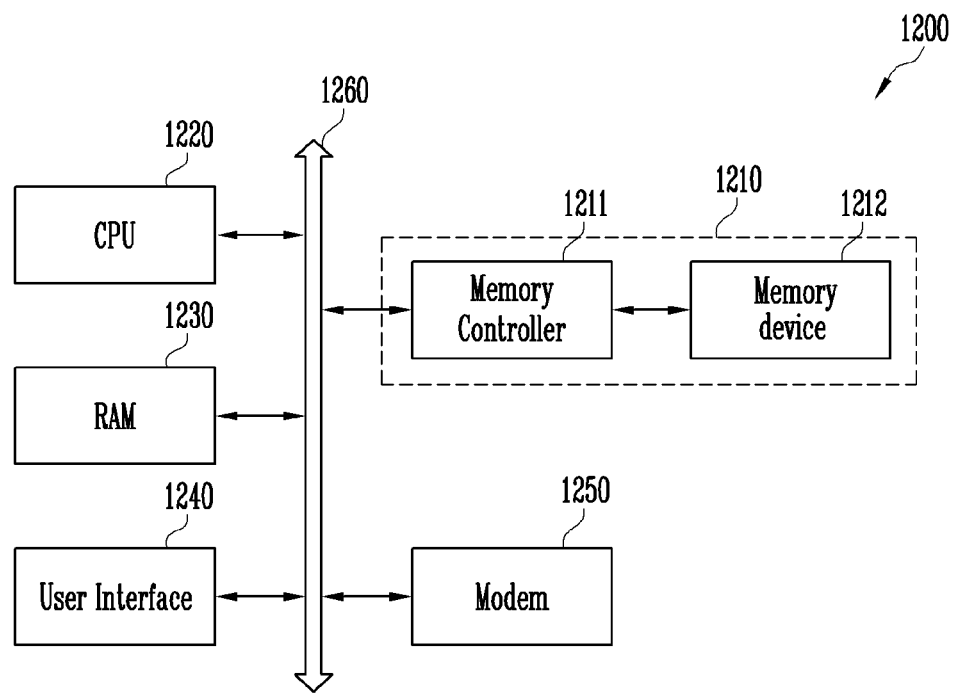
FIG. 12 is a block diagram illustrating a computing system, according to an embodiment of the present disclosure.

FIG. 12 is a block diagram illustrating a computing system according to an embodiment of the present disclosure.

Referring to FIG. 12, the computing system 1200 according to the embodiment of the present disclosure may include a CPU 1220, a random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, a Camera Image Processor (CIS), a mobile D-RAM, and the like may be further included.

The memory system 1210 may include a memory device 1212 and a memory controller 1211.

Exemplary embodiments of the present disclosure have been shown in the drawings and described in the written description. Although specific terminologies are used here, those are only to explain embodiments of the present disclosure. Therefore, the present disclosure is not restricted to the above-described embodiments and many variations are possible within the spirit and scope of the present disclosure as claimed below. It should be apparent to those skilled in the art that various modifications can be made on the basis of the technological scope of the present disclosure in addition to the embodiments disclosed herein.

So far as not being differently defined, all terms used herein including technical or scientific terminologies have meanings that they are commonly understood by those skilled in the art to which the present disclosure pertains. The terms having the definitions as defined in the dictionary should be understood such that they have meanings consistent with the context of the related technique. So far as not being clearly defined in this application, terms should not be understood in an ideally or excessively formal way.

What is claimed is:

1. A semiconductor device comprising:
   a first conductive pattern comprising a first line portion extending in a first direction and a first bending portion that extends from the first line portion, wherein a closed area, surrounded by the first line portion and the first bending portion, is defined at one side of the first line portion and wherein the first line portion includes a first area forming the closed area together with the first bending portion, a second area extending from the first area to protrude in the first direction beyond the first bending portion, and a third area extending from the first area to protrude in a direction opposite to the first direction beyond the first bending portion;
   a second conductive pattern disposed in the closed area, the second conductive pattern being spaced apart from the first conductive pattern; and
   a third conductive pattern comprising a second bending portion extending in parallel to the first bending portion and second line portions one of the second line portions having a length extending in parallel to the second area of the first line portion and away from the first bending portion from one end of the second bending portion, another of the second line portions having a length extending in parallel to the third area of the first line portion and away from the first bending portion from the other end of the second bending portion, wherein each of the second line portions is spaced apart from the first line portion by a distance between the first conductive pattern and the second conductive pattern.

2. The semiconductor device of claim 1, further comprising:
   a lower conductive pattern;
   a lower insulating layer covering the lower conductive pattern;
   a lower contact plug penetrating the lower insulating layer to be connected to the lower conductive pattern; and
   an insulating layer disposed on the lower insulating layer, wherein the first conductive pattern, the second conductive pattern and the third conductive pattern penetrate the insulating layer, and
   wherein the second conductive pattern is connected to the lower contact plug.

3. The semiconductor device of claim 1, further comprising:
   an insulating layer penetrated by the first conductive pattern, the second conductive pattern and the third conductive pattern;
   an upper insulating layer disposed on the insulating layer;
   an upper contact plug penetrating the upper insulating layer to be connected to the second conductive pattern; and
   an upper conductive pattern connected to the upper contact plug, the upper conductive pattern extending over the upper insulating layer.

4. The semiconductor device of claim 1, wherein the second line portions are disposed to be spaced apart from the first line portion in a second direction perpendicular to the first direction.

5. The semiconductor device of claim 4, further comprising:
   fourth conductive patterns extending in parallel to the second line portions, the fourth conductive patterns being adjacent to the second line portions in the second direction; and
   fifth conductive patterns extending in parallel to the second line portions, the fifth conductive patterns being adjacent to the fourth conductive patterns in the second direction.

6. The semiconductor device of claim 5, wherein the second bending portion extends between the fifth conductive patterns from between the fourth conductive patterns,
   wherein the fourth conductive patterns are spaced apart from the second bending portion by a first distance, and
   wherein the fifth conductive patterns are spaced apart from the second bending portion by a second distance larger than the first distance.

* * * * *